(12) United States Patent
Lee et al.

(10) Patent No.: US 11,177,362 B2
(45) Date of Patent: Nov. 16, 2021

(54) SEMICONDUCTOR DEVICE

(71) Applicant: SAMSUNG ELECTRONICS CO., LTD., Suwon-si (KR)

(72) Inventors: Doohyun Lee, Hwaseong-si (KR);
Heonjong Shin, Yongin-si (KR);
Minchan Gwak, Hwaseong-si (KR);
Hyunho Park, Suwon-si (KR);
Sunghun Jung, Suwon-si (KR);
Yongsik Jeong, Suwon-si (KR);
Sangwon Jee, Hwaseong-si (KR);
Inchan Hwang, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/829,372

(22) Filed: Mar. 25, 2020

(65) Prior Publication Data
US 2021/0057536 A1     Feb. 25, 2021

(30) Foreign Application Priority Data

Aug. 20, 2019   (KR) ........................ 10-2019-0101855

(51) Int. Cl.
*H01L 29/45*     (2006.01)
*H01L 27/092*     (2006.01)
*H01L 29/06*     (2006.01)
*H01L 29/08*     (2006.01)
(Continued)

(52) U.S. Cl.
CPC ...... *H01L 29/45* (2013.01); *H01L 21/823807* (2013.01); *H01L 21/823821* (2013.01);
(Continued)

(58) Field of Classification Search
CPC . H01L 29/45; H01L 29/0653; H01L 29/0673; H01L 29/0847; H01L 29/41733; H01L 29/41791; H01L 29/42392; H01L 29/66545; H01L 29/78618; H01L 29/78696; H01L 21/823807; H01L 21/823821; H01L 21/823828; H01L 21/823871; H01L 21/823878; H01L 27/0924
(Continued)

(56) References Cited

U.S. PATENT DOCUMENTS 9,876,016 B2    1/2018   Steigerwald et al.
10,008,497 B2    6/2018   Lee et al.
(Continued)

*Primary Examiner* — Tong-Ho Kim
(74) *Attorney, Agent, or Firm* — F. Chau & Associates, LLC

(57) ABSTRACT

A semiconductor device including: a substrate that includes a first active region and a second active region; a first source/drain pattern on the first active region; a second source/drain pattern on the second active region; a separation dielectric pattern on the substrate between the first source/drain pattern and the second source/drain pattern; and a first contact pattern on the first source/drain pattern, wherein the first contact pattern includes: a first metal pattern; a first barrier pattern between the first metal pattern and the first source/drain pattern; and a second barrier pattern between the first barrier pattern and the first source/drain pattern, wherein the first barrier pattern contacts the separation dielectric pattern and extends along a sidewall of the first metal pattern adjacent to the separation dielectric pattern.

19 Claims, 44 Drawing Sheets

(51) Int. Cl.

| | |
|---|---|
| *H01L 29/417* | (2006.01) |
| *H01L 29/423* | (2006.01) |
| *H01L 29/786* | (2006.01) |
| *H01L 21/8238* | (2006.01) |
| *H01L 29/66* | (2006.01) |

(52) U.S. Cl.
CPC ......... *H01L 21/823828* (2013.01); *H01L 21/823871* (2013.01); *H01L 21/823878* (2013.01); *H01L 27/0924* (2013.01); *H01L 29/0653* (2013.01); *H01L 29/0673* (2013.01); *H01L 29/0847* (2013.01); *H01L 29/41733* (2013.01); *H01L 29/41791* (2013.01); *H01L 29/42392* (2013.01); *H01L 29/66545* (2013.01); *H01L 29/78618* (2013.01); *H01L 29/78696* (2013.01)

(58) Field of Classification Search
USPC .................................................. 257/351
See application file for complete search history.

(56) References Cited

U.S. PATENT DOCUMENTS

| | | |
|---|---|---|
| 2014/0273365 A1 | 9/2014 | Wei et al. |
| 2018/0108749 A1 | 4/2018 | Greene et al. |
| 2018/0358293 A1* | 12/2018 | Hong .................... H01L 23/485 |
| 2019/0074225 A1 | 3/2019 | Yang et al. |
| 2019/0097051 A1 | 3/2019 | Tsai et al. |
| 2019/0109043 A1 | 4/2019 | Wang et al. |
| 2019/0109136 A1 | 4/2019 | Ching et al. |

\* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2019-0101855 filed on Aug. 20, 2019, in the Korean Intellectual Property Office, the disclosure of which is incorporated by reference herein in its entirety.

TECHNICAL FIELD

The present inventive concept relates to a semiconductor device, and more particularly, to a semiconductor device with increased reliability.

DISCUSSION OF RELATED ART

A semiconductor device may include an integrated circuit formed with metal oxide semiconductor field effect transistors (MOSFETs). A MOSFET is a type of insulated-gate field-effect transistor that is fabricated by the controlled oxidation of a semiconductor, typically silicon. As a semiconductor device including MOSFETs becomes highly integrated, the MOSFETs are also scaled down; however, this may cause the operating characteristics of the semiconductor device to deteriorate. Therefore, various techniques are being developed to manufacture a semiconductor device with MOSFETS that has superior performance and high integration.

SUMMARY

According to exemplary embodiments of the present inventive concept, a semiconductor device may comprise: a substrate that includes a first active region and a second active region; a first source/drain pattern on the first active region; a second source/drain pattern on the second active region; a separation dielectric pattern on the substrate between the first source/drain pattern and the second source/drain pattern; and a first contact pattern on the first source/drain pattern, wherein the first contact pattern includes: a first metal pattern; a first barrier pattern between the first metal pattern and the first source/drain pattern; and a second barrier pattern between the first barrier pattern and the first source/drain pattern, wherein the first barrier pattern contacts the separation dielectric pattern and extends along a sidewall of the first metal pattern adjacent to the separation dielectric pattern.

According to exemplary embodiments of the present inventive concept, a semiconductor device may comprise: a first active fin that protrudes in a vertical direction from a top surface of a substrate; a first source/drain pattern on the first active fin; an interlayer dielectric layer that is on the substrate and covers the first source/drain pattern; and a first contact pattern in the interlayer dielectric layer and in contact with the first source/drain pattern, wherein the first contact pattern includes: a first metal pattern; a first barrier pattern between the first metal pattern and the first source/drain pattern; and a second barrier pattern between the first barrier pattern and the first metal pattern, wherein the second barrier pattern is arranged along sidewalls of the first metal pattern, and wherein a portion of the second barrier pattern is exposed by the first barrier pattern.

According to exemplary embodiments of the present inventive concept, a semiconductor device may comprise: a plurality of active fins that protrude from a top surface of a substrate and extend in a first direction, the active fins being adjacent to each other; a gate pattern arranged in a second direction across the active fins, the second direction intersecting the first direction; a first source/drain pattern on the active fins on a first side of the gate pattern; and a first contact pattern on the first source/drain pattern, wherein the first contact pattern includes: a first metal pattern; and a first barrier pattern that covers a first sidewall and a second sidewall of the first metal pattern, wherein the first barrier pattern includes a first part that covers the first sidewall of the first metal pattern and a second part that covers the second sidewall of the first metal pattern, wherein the first part includes a single layer, and wherein the second part includes a plurality of layers.

DETAILED DESCRIPTION OF THE EMBODIMENTS

Figure 1:
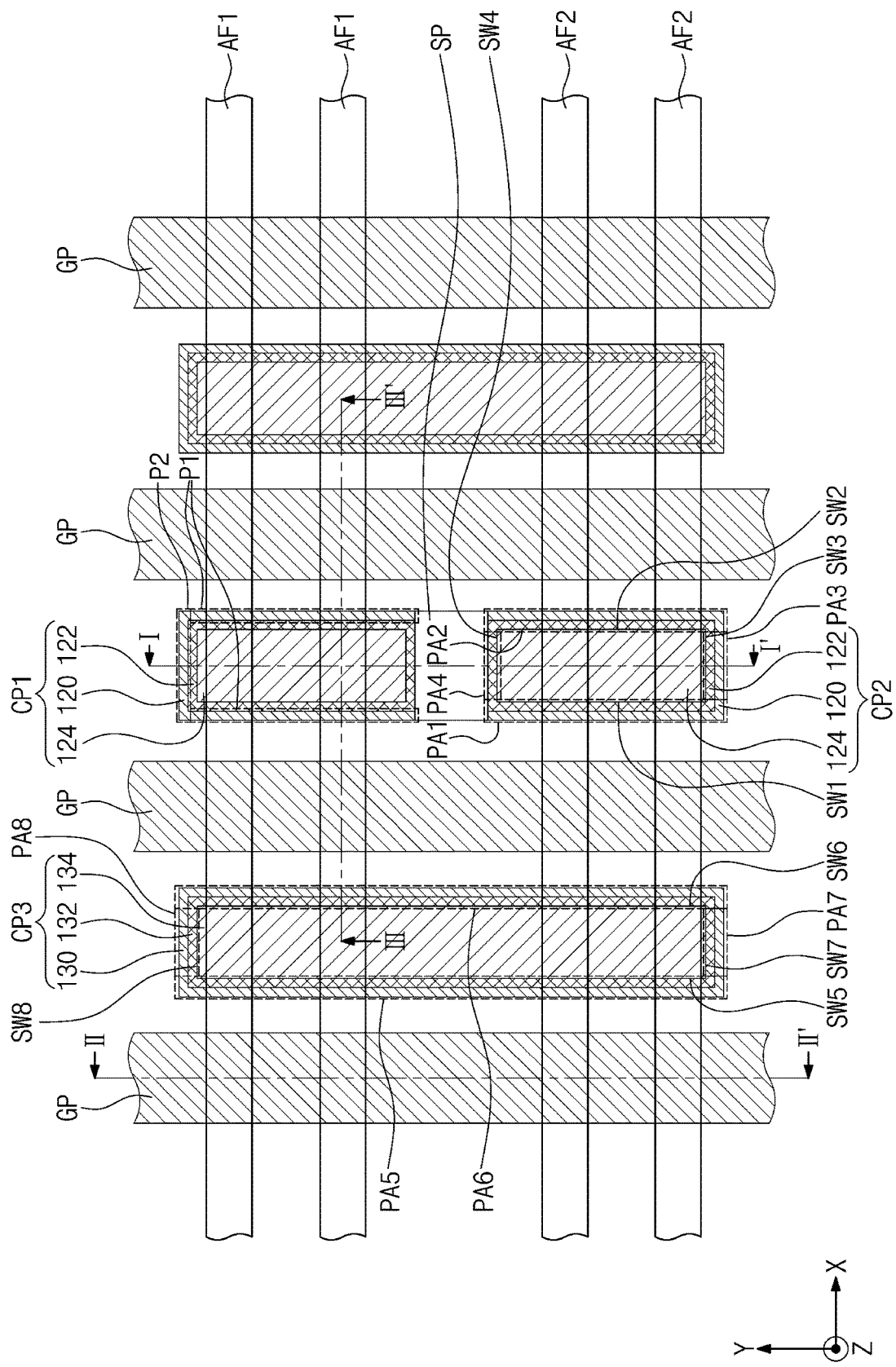
FIG. 1 illustrates a plan view showing a semiconductor device according to exemplary embodiments of the present inventive concept.
Figure 2A:
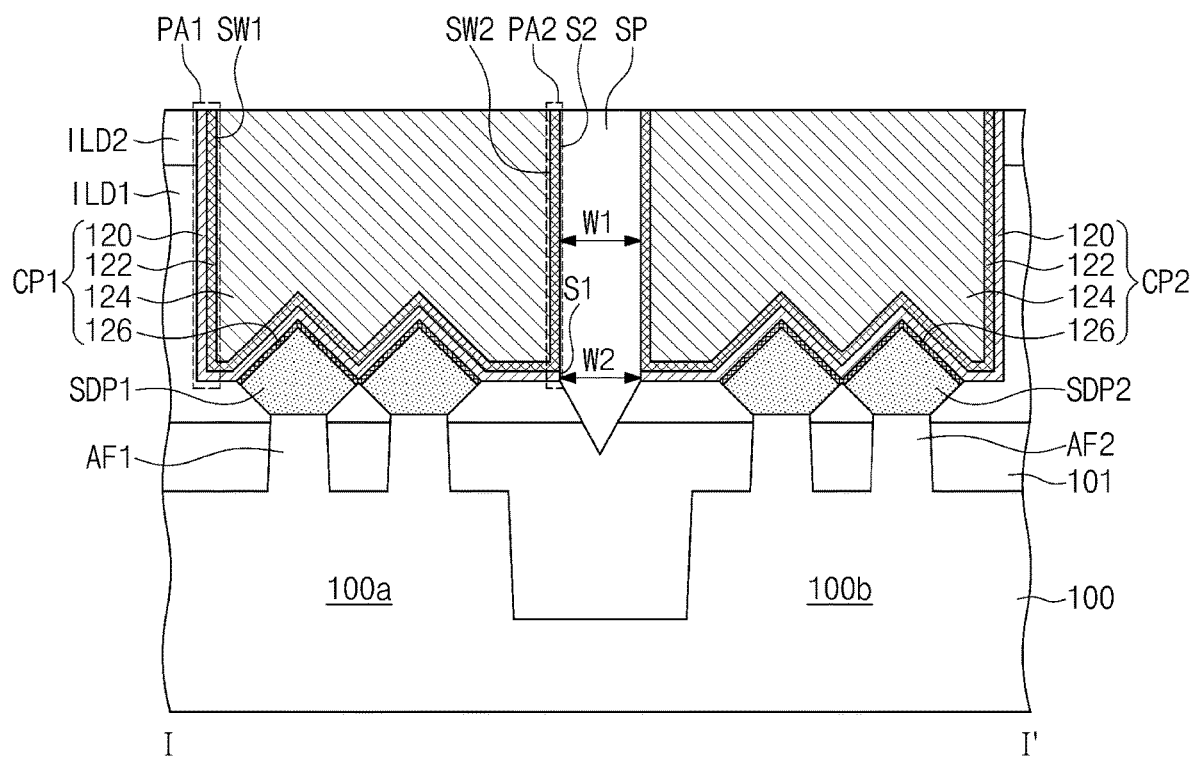
FIG. 2A illustrates a cross-sectional view taken along line I-I' of FIG. 1, showing a semiconductor device according to exemplary embodiments of the present inventive concept.
Figure 2B:
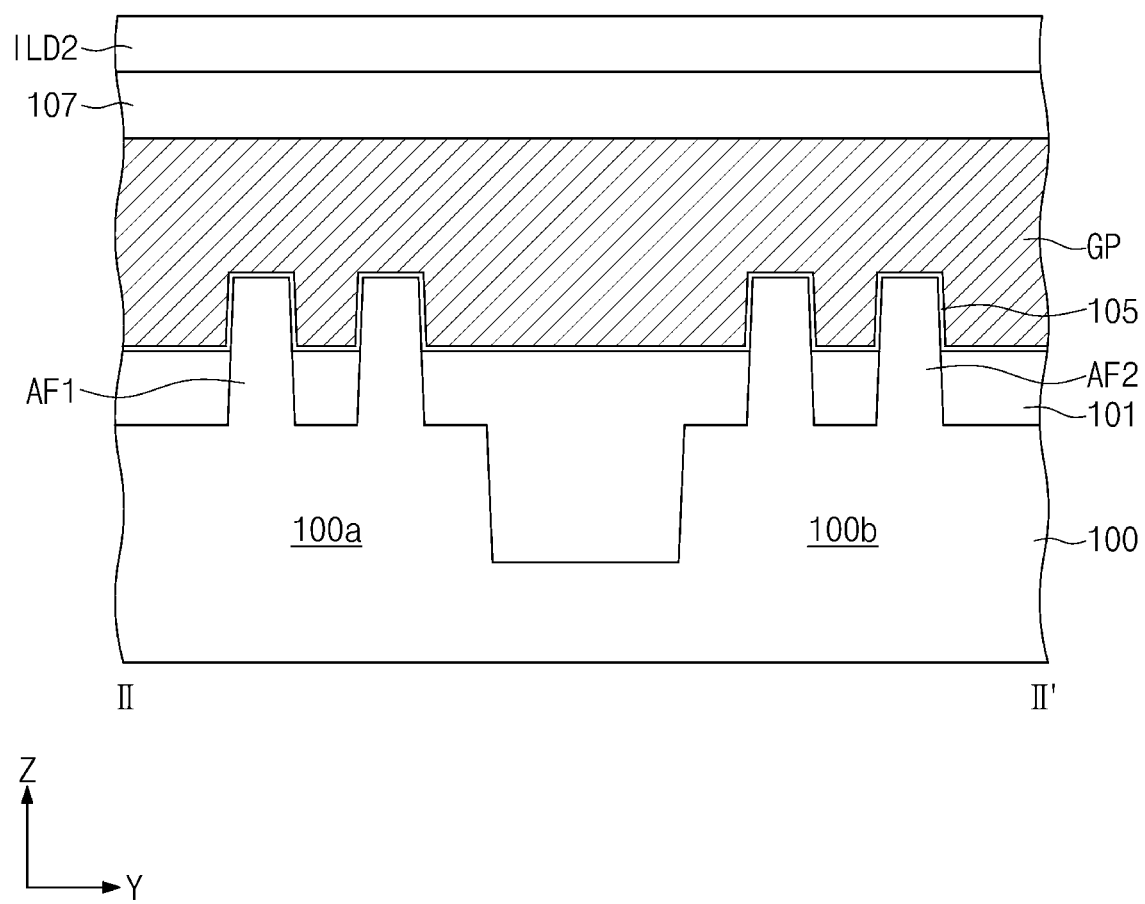
FIG. 2B illustrates a cross-sectional view taken along line II-II' of FIG. 1, showing a semiconductor device according to exemplary embodiments of the present inventive concept.
Figure 2C:
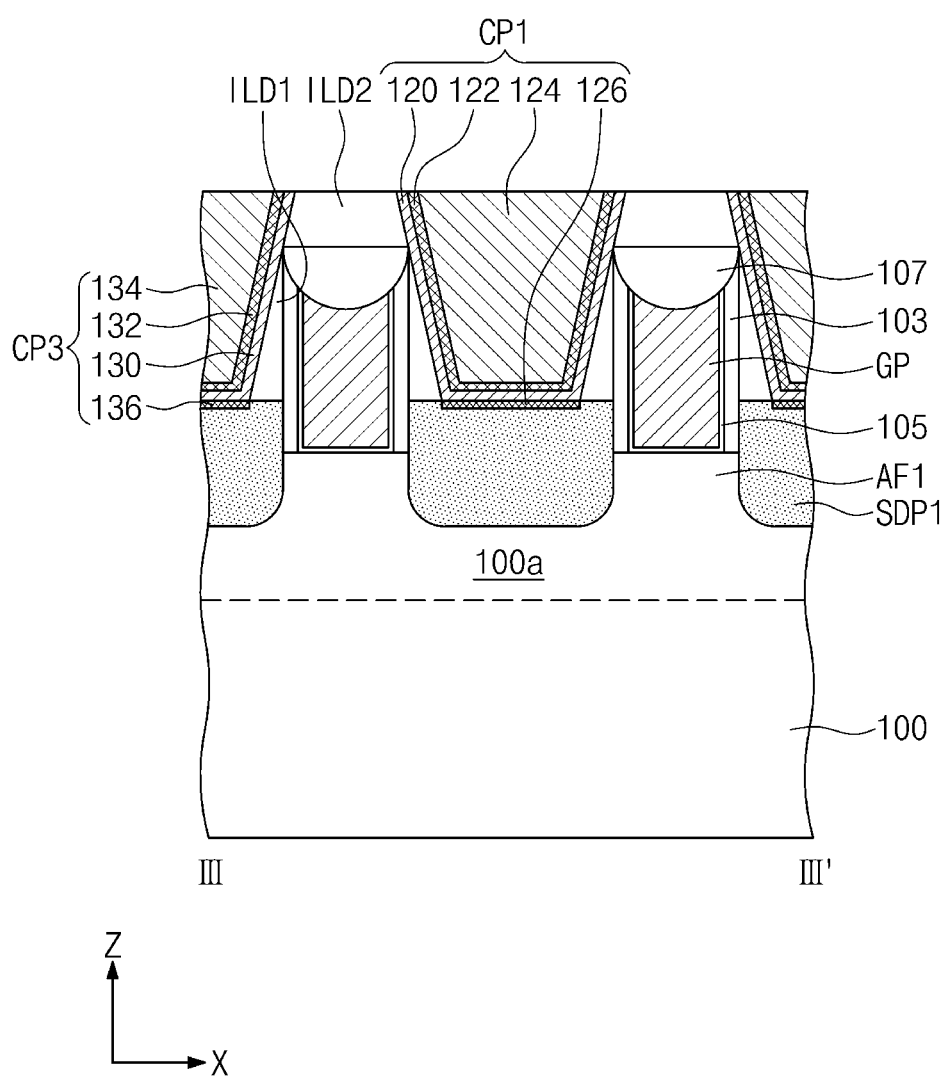
FIG. 2C illustrates a cross-sectional view taken along line III-II' of FIG. 2, showing a semiconductor device according to exemplary embodiments of the present inventive concept.
Figure 3:
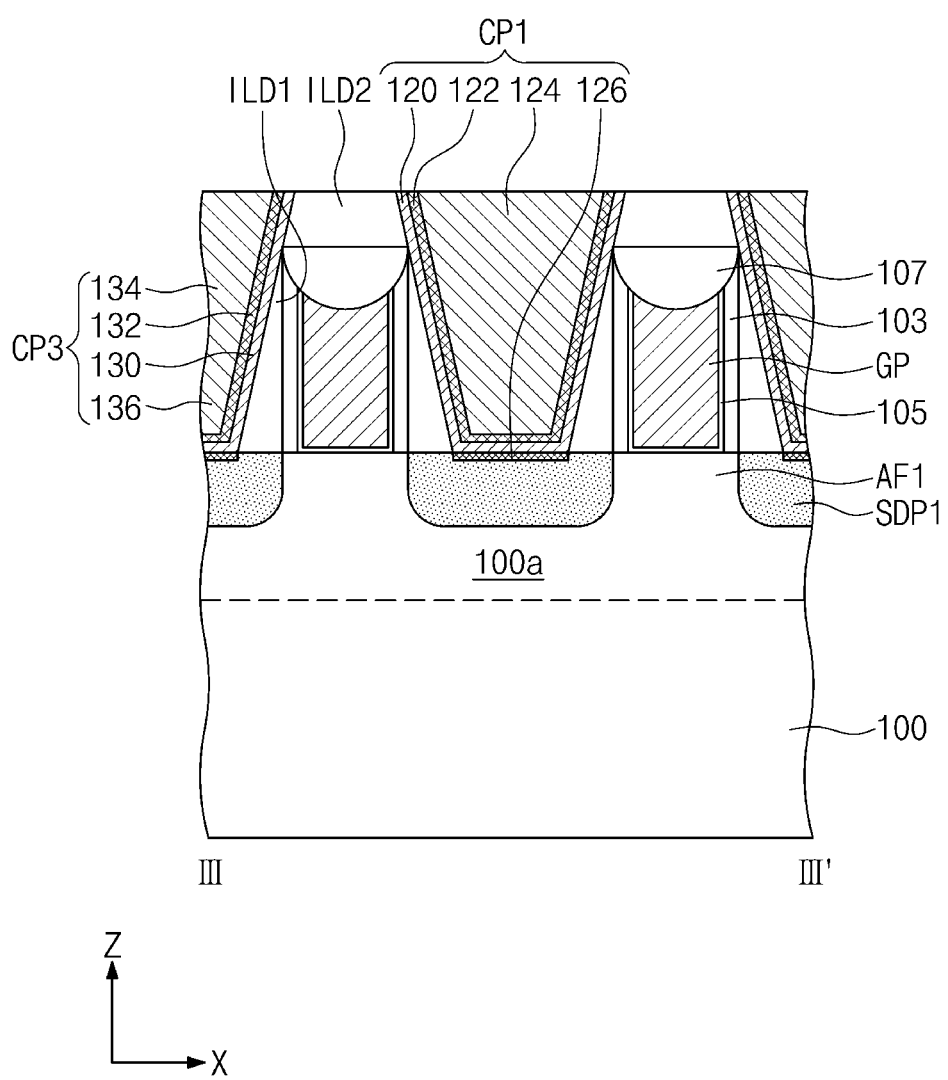
FIG. 3 illustrates a cross-sectional view taken along line II-II' of FIG. 1, showing a semiconductor device according to exemplary embodiments of the present inventive concept.

FIG. 1 illustrates a plan view showing a semiconductor device according to exemplary embodiments of the present inventive concept. FIG. 2A illustrates a cross-sectional view taken along line I-I' of FIG. 1, showing a semiconductor device according to exemplary embodiments of the present inventive concept. FIG. 2B illustrates a cross-sectional view taken along line II-II' of FIG. 1, showing a semiconductor device according to exemplary embodiments of the present inventive concept. FIG. 2C illustrates a cross-sectional view taken along line III-III' of FIG. 1, showing a semiconductor device according to exemplary embodiments of the present inventive concept. FIG. 3 illustrates a cross-sectional view taken along line III-III' of FIG. 1, showing a semiconductor device according to exemplary embodiments of the present inventive concept.

Referring to FIGS. 1, 2A, 2B, and 2C, a device isolation layer 101 may be disposed in a substrate 100. The device isolation layer 101 may define active regions 100a and 100b of the substrate 100. The active regions 100a and 100b may include a first active region 100a and a second active region 100b. The first and second active regions 100a and 100b may be spaced apart from each other in a second direction Y intersecting a first direction X. For example, the first active region 100a may be an n-type metal-oxide-semiconductor (NMOS) region, and the second active region 100b may be a p-type metal-oxide-semiconductor (PMOS) region. As another example, the first and second active regions 100a and 100b may be NMOS regions. As another example, the first and second active regions 100a and 100b may be PMOS regions. As another example, the first active region 100a may be a PMOS region and the second active region 100b may be an NMOS region. The device isolation layer 101 may include a dielectric material (e.g., a silicon oxide layer or a silicon nitride layer). Active fins AF1 and AF2 may protrude in a vertical direction (e.g., a third direction Z) from a top surface of the substrate 100. The active fins AF1 and AF2 may extend in the first direction X intersecting the third direction Z and may be arranged in the second direction Y. The active fins AF1 and AF2 may include first active fins AF1 and second active fins AF2. The first active fins AF1 may be disposed on the first active region 100a of the substrate 100, and the second active fins AF2 may be disposed on the second active region 100b of the substrate 100.

Gate patterns GP may run in the second direction Y across the first and second active fins AF1 and AF2. The gate patterns GP may be spaced apart from each other in the first direction X. Top surfaces and sidewalls of the first and second active fins AF1 and AF2 may be exposed by the device isolation layer 101 and covered with the gate patterns GP. For example, top surfaces and sidewalls of the first and second active fins AF1 and AF2 may protrude into the gate patterns GP. The gate patterns GP may include metal (e.g., tungsten, copper, or aluminum) or metal nitride (e.g., titanium nitride layer or tantalum nitride layer).

Spacers 103 may be disposed on sidewalls of each of the gate patterns GP. The spacers 103 may cover the sidewalls of the gate patterns GP. The spacers 103 may include a dielectric material (e.g., a silicon oxide layer or a silicon nitride layer). A gate dielectric layer 105 may be disposed between each of the gate patterns GP and the first and second active fins AF1 and AF2. The gate dielectric layer 105 may extend from between the gate pattern GP and the first and second active fins AF1 and AF2 to an area between the gate pattern GP and a top surface of the device isolation layer 101. The gate dielectric layer 105 may be interposed between the gate pattern GP and the spacers 103. The gate dielectric layer 105 may include, for example, a silicon oxide layer or a thermal oxide layer.

A capping pattern 107 may be disposed on each of the gate patterns GP. For example, the capping pattern 107 may be disposed on a top surface of the gate pattern GP, a top surface of the gate dielectric layer 105, and top surfaces of the spacers 103. The capping pattern 107 may have a bottom surface that convexly protrudes toward the top surface of the substrate 100 and a top surface that is parallel to the top surface of the substrate 100. The capping pattern 107 may include a dielectric material (e.g., a silicon nitride layer or a silicon oxynitride layer).

First source/drain patterns SDP1 may be disposed on the first active fins AF1 between the gate patterns GP. The top surfaces of the first active fins AF1 between the gate patterns GP may be located at a lower level than the top surfaces of the first active fins AF1 below the gate patterns GP. The first source/drain patterns SDP1 may have their top surfaces at a higher level than the top surfaces of the first active fins AF1 below the gate pattern GP. Alternatively, as shown in FIG. 3, the first source/drain patterns SDP1 may have their top surfaces coplanar with the top surfaces of the first active fins AF1 below the gate pattern GP. The first source/drain pattern SDP1 may be a single pattern in which are merged a plurality of epitaxial patterns disposed on the first active fins AF1 adjacent to each other in the second direction Y. For example, the first source/drain patterns SDP1 may be shaped like a combination of a plurality of pentagonal epitaxial patterns. The first source/drain patterns SDP1 may have a zigzag shape at their top surfaces. The first source/drain patterns SDP1 may be doped with N-type or P-type impurities.

Second source/drain patterns SDP2 may be disposed on the second active fins AF2 between the gate patterns GP. The second active fins AF2 between the gate patterns GP may have their top surfaces at a lower level than top surfaces of the second active fins AF2 below the gate patterns GP. The second source/drain patterns SDP2 may be a single pattern in which are merged a plurality of epitaxial patterns disposed on the second active fins AF2 adjacent to each other in the second direction Y. For example, the second source/drain patterns SDP2 may be shaped like a combination of a plurality of pentagonal epitaxial patterns. The second source/drain patterns SDP2 may have a zigzag shape at their top surfaces. The second source/drain patterns SDP2 may be doped with N-type or P-type impurities.

A first interlayer dielectric layer ILD1 may be disposed on the first and second source/drain patterns SDP1 and SDP2. The first interlayer dielectric layer ILD1 may cover the top surfaces of the first and second source/drain patterns SDP1 and sidewalls of the spacers 103. The first interlayer dielectric layer ILD1 may have a top surface coplanar with top surfaces of the capping patterns 107. The first interlayer dielectric layer ILD1 may include a dielectric material (e.g., a silicon oxide layer). A second interlayer dielectric layer ILD2 may be disposed on the first interlayer dielectric layer ILD1. The second interlayer dielectric layer ILD2 may cover the top surface of the first interlayer dielectric layer ILD1 and the top surfaces of the capping patterns 107. The second interlayer dielectric layer ILD2 may include a dielectric material (e.g., a silicon oxide layer).

A first contact pattern CP1 may be disposed on the first active region 100a of the substrate 100. The first contact pattern CP1 may be placed on the first source/drain pattern SDP1 between the gate patterns GP adjacent to each other in the first direction X. The first contact pattern CP1 may be in contact with the top surface of the first source/drain pattern SDP1. The first contact pattern CP1 may run in the second direction Y across the first active fins AF1. A second contact pattern CP2 may be disposed on the second active region 100b of the substrate 100. The second contact pattern CP2 may be placed on the second source/drain pattern SDP2 between the gate patterns GP adjacent to each other in the first direction X. The second contact pattern CP2 may be in contact with the top surface of the second source/drain pattern SDP2. The second contact pattern CP2 may run in the second direction Y across the second active fins AF2. The first and second contact patterns CP1 and CP2 may be spaced apart from each other in the second direction Y. For example, as shown in FIG. 1, the first and second contact patterns CP1 and CP2 may be spaced apart from each other in the second direction Y without one of the first and second active regions 100a and 100b disposed therebetween.

A separation dielectric pattern SP may be disposed between the first and second contact patterns CP1 and CP2. The separation dielectric pattern SP may penetrate the second interlayer dielectric layer ILD2, and the first interlayer dielectric layer ILD1, and may be disposed in an upper portion of the device isolation layer 101. The separation dielectric pattern SP may physically separate the first and second contact patterns CP1 and CP2 from each other. The separation dielectric pattern SP may include a dielectric material (e.g., a silicon oxide layer).

Each of the first and second contact patterns CP1 and CP2 may include a first barrier pattern 120, a second barrier pattern 122, a metal pattern 124, and an interfacial pattern 126. The metal pattern 124 may penetrate the second interlayer dielectric layer ILD2 and may be disposed in the first interlayer dielectric layer ILD1. The metal pattern 124 may be spaced apart from the separation dielectric pattern SP. For example, the second barrier pattern 122 may be disposed between the metal pattern 124 and the separation dielectric pattern SP. The metal pattern 124 may include one or more of tungsten (W), cobalt (Co), and ruthenium (Ru). The metal pattern 124 of each of the first and second contact patterns CP1 and CP2 may have a first sidewall SW1, a second sidewall SW2, a third sidewall SW3, and a fourth sidewall SW4. The first and second sidewalls SW1 and SW2 may be disposed spaced apart from each other in the first direction X and may be parallel to the second direction Y. The third and fourth sidewalls SW3 and SW4 may be disposed spaced apart from each other in the second direction Y and may be parallel to the first direction X. The fourth sidewall SW4 of the metal pattern 124 may be adjacent to the separation dielectric pattern SP.

The second barrier pattern 122 may be disposed on the sidewalls of the metal pattern 124. The second barrier pattern 122 of the first contact pattern CP1 may be interposed between the metal pattern 124 and the first source/drain pattern SDP1, and the second barrier pattern 122 of the second contact pattern CP2 may be interposed between the metal pattern 124 and the second source/drain pattern SDP2. The second barrier pattern 122 may completely surround the sidewalls of the metal pattern 124. For example, in a plan view, the second barrier pattern 122 may surround the first, second, third, and fourth sidewalls SW1, SW2, SW3, and SW4 of the metal pattern 124. The second barrier pattern 122 may be in contact with one sidewall of the separation dielectric pattern SP. For example, the second barrier pattern 122 may be disposed between the one sidewall of the separation dielectric pattern SP and the fourth sidewall SW4 of the metal pattern 124. The second barrier pattern 122 may have a top surface coplanar with that of the metal pattern 124 and that of the separation dielectric pattern SP. When viewed in a plan, the second barrier pattern 122 may have a rectangular ring shape. The second barrier pattern 122 may include one or more of titanium (Ti) and titanium nitride (TiN).

The first barrier pattern 120 may be disposed on sidewalls of the second barrier pattern 122. The first barrier pattern 120 of the first contact pattern CP1 may be interposed between the second barrier pattern 122 and the first source/drain pattern SDP1, and the first barrier pattern 120 of the second contact pattern CP2 may be interposed between the second barrier pattern 122 and the second source/drain pattern SDP2. In a plan view, the first barrier pattern 120 may cover at least one sidewall of the second barrier pattern 122 and may expose at least one of the second barrier pattern 122. For example, the first barrier pattern 120 may cover the sidewalls of the second barrier pattern 122 that cover the first, second, and third sidewalls SW1, SW2, and SW3 of the metal pattern 124. The first barrier pattern 120 may expose the sidewall of the second barrier pattern 122 that covers the fourth sidewall SW4 of the metal pattern 124. In other words, the first barrier pattern 120 may not cover the fourth sidewall SW4 of the metal pattern 124.

In an exemplary embodiment of the present inventive concept, a second distance W2 in the second direction Y between the first barrier pattern 120 of the first contact pattern CP1 and the first barrier pattern 120 of the second contact pattern CP2 may be substantially the same as a first distance W1 in the second direction Y between the second barrier pattern 122 of the first contact pattern CP1 and the second barrier pattern 122 of the second contact pattern CP2 (W1=W2). The second distance W2 may correspond to a thickness in the second direction Y of the separation dielectric pattern SP between the first barrier pattern 120 of the first contact pattern CP1 and the first barrier pattern 120 of the second contact pattern CP2. The first distance W1 may correspond to a thickness in the second direction Y of the separation dielectric pattern SP between the second barrier pattern 122 of the first contact pattern CP1 and the second barrier pattern 122 of the second contact pattern CP2. The first and second barrier patterns 120 and 122 may have respective sidewalls S1 and S2 that contact the separation dielectric pattern SP, and the sidewalls S1 and S2 may be aligned with each other.

When viewed in a plan, the first barrier pattern 120 may include first segments P1 and a second segment P2. The first segments P1 may be parallel to the second direction Y and may be spaced apart from each other in the first direction X. The second segment P2 may contact first ends of the first segments P1 and may connect the first ends to each other. First ends of the first barrier pattern 120 may be spaced apart from the separation dielectric pattern SP, and second ends of the first barrier pattern 120 opposite to the first ends of the first barrier pattern 120 may be adjacent to and in contact with the separation dielectric pattern SP. When viewed in a plan, the first barrier pattern 120 may have a U shape. The first barrier pattern 120 may include one or more of titanium (Ti) and titanium nitride (TiN).

In an exemplary embodiment of the present inventive concept, a multiple layer may be included in portions of a barrier pattern that are disposed on the first, second, and third sidewalls SW1, SW2, and SW3 of the metal pattern 124 of each of the first and second contact patterns CP1 and CP2. The barrier pattern may include a first part PA1, a second part PA2, a third part PA3, and a fourth part PA4. The first part PA1 may be a portion of the barrier pattern on the first sidewall SW1 of the metal pattern 124. The second part PA2 may be a portion of the barrier pattern on the second sidewall SW2 of the metal pattern 124. The third part PA3 may be a portion of the barrier pattern on the third sidewall SW3 of the metal pattern 124. The fourth part PA4 may be a portion of the barrier pattern on the fourth sidewall SW4 of the metal pattern 124. For example, the first, second, and third parts PA1, PA2, and PA3 of the barrier pattern may include the first barrier pattern 120 and the second barrier pattern 122. In this case, the first, second, and third parts PA1, PA2, and PA3 may include a multiple layer. The fourth part PA4 of the barrier pattern may be a single layer. For example, the fourth part PA4 of the barrier pattern may be the second barrier pattern 122. The first, second, and third parts PA1, PA2, and PA3 of the barrier pattern may each be thicker than the fourth part PA4 of the barrier pattern.

The interfacial patterns 126 may be disposed between the first source/drain pattern SDP1 and the first barrier pattern 120 and between the second source/drain pattern SDP2 and the first barrier pattern 120. The interfacial patterns 126 may cover the top surfaces of the first and second source/drain patterns SDP1 and SDP2. The interfacial patterns 126 may include a semiconductor material and a metallic material. The interfacial patterns 126 may include, for example, $TiSi_2$.

A third contact pattern CP3 may be disposed on the first and second source/drain patterns SDP1 and SDP2 between neighboring gate patterns GP. The third contact pattern CP3 may be placed on the first active region 100a and the second active region 100b of the substrate 100, and may run in the second direction Y across the first active fins AF1 and the second active fins AF2. The third contact pattern CP3 may contact the first and second source/drain patterns SDP1 and SDP2. The third contact pattern CP3 may be spaced apart in the first direction X from the first and second contact patterns CP1 and CP2. For example, a gate pattern GP may be disposed between the third contact pattern CP3 and both of the first and second contact patterns CP1 and CP2. The third contact pattern CP3 may include a first barrier pattern 130, a second barrier pattern 132, a metal pattern 134, and an interfacial pattern 136. The metal pattern 134 may penetrate the second interlayer dielectric layer ILD2 and may be disposed in the first interlayer dielectric layer ILD1. The metal pattern 134 may include one or more of tungsten (W), cobalt (Co), and ruthenium (Ru). The metal pattern 134 may have a fifth sidewall SW5, a sixth sidewall SW6, a seventh sidewall SW7, and an eighth sidewall SW8. The fifth and sixth sidewalls SW5 and SW6 may be spaced apart from each other in the first direction X and may be parallel to the second direction Y. The fifth and sixth sidewalls SW5 and SW6 may be parallel to the first and second sidewalls SW1 and SW2 of the metal pattern 124. The seventh and eight sidewalls SW7 and SW8 may be spaced apart from each other in the second direction Y and may be parallel to the first direction X. The seventh and eighth sidewalls SW7 and SW8 may be parallel to the third and fourth sidewalls SW3 and SW4 of the metal pattern 124.

The second barrier pattern 132 may cover sidewalls of the first metal pattern 134, and may be interposed between the metal pattern 134 and the first source/drain pattern SDP1 and between the metal pattern 134 and the second source/drain pattern SDP2. The second barrier pattern 132 may surround the sidewalls of the metal pattern 134. For example, the second barrier pattern 132 may completely surround the fifth, sixth, seventh, and eighth sidewalls SW5, SW6, SW7, and SW8 of the metal pattern 134. When viewed in a plan, the second barrier pattern 132 may have a rectangular ring shape. The second barrier pattern 132 may include, for example, one or more of titanium (Ti) and titanium nitride (TiN). The first barrier pattern 130 may cover sidewalls of the second barrier pattern 132, and may be interposed between the second barrier pattern 132 and the first source/drain pattern SDP1 and between the second barrier pattern 132 and the second source/drain pattern SDP2. The first barrier pattern 130 may completely surround the sidewalls of the second barrier pattern 132. When viewed in a plan, the first barrier pattern 130 may have a rectangular ring shape. The first barrier pattern 130 may include, for example, one or more of titanium (Ti) and titanium nitride (TiN). The interfacial pattern 136 of the third contact pattern CP3 may be disposed between the first barrier pattern 130 and the first source/drain pattern SDP1 and between the first barrier pattern 130 and the second source/drain pattern SDP2. The interfacial pattern 136 may include a semiconductor material and a metallic material. For example, the interfacial pattern 136 may include $TiSi_2$.

In an exemplary embodiment of the present inventive concept, a multiple layer may be included in a barrier pattern on the fifth, sixth, and seventh sidewalls SW5, SW6, and SW7 of the metal pattern 134 of the third contact pattern CP3. The barrier pattern may include a fifth part PA, a sixth part PA6, a seventh part PA7, and an eighth part PA8. The fifth part PA5 may be a portion of the barrier pattern on the fifth sidewall SW5 of the metal pattern 134. The sixth part PA6 may be a portion of the barrier pattern on the sixth sidewall SW6 of the metal pattern 134. The seventh part PA7 may be a portion of the barrier pattern on the seventh sidewall SW7 of the metal pattern 134. The eighth part PA8 may be a portion of the barrier pattern on the eighth sidewall SW8 of the metal pattern 134. For example, the fifth, sixth, seventh, and eighth parts PA5, PA6, PA7, and PA8 of the barrier pattern may include the first barrier pattern 130 and the second barrier pattern 132. In this case, the fifth, sixth, seventh, and eighth parts PA5, PA6, PA7, and PA8 may include a multiple layer. The fifth, sixth, seventh, and eighth parts PA5, PA6, PA7, and PA8 may have the same thickness.

Figure 4A:
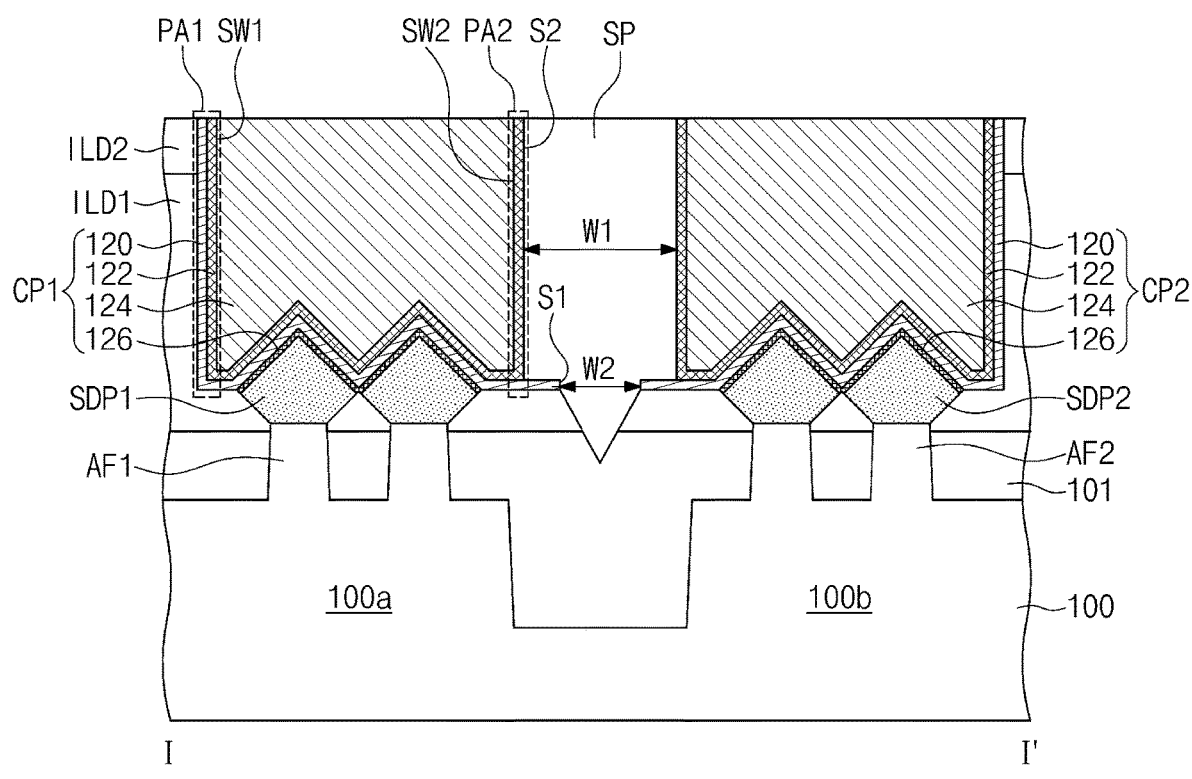
FIG. 4A illustrates a cross-sectional view taken along line I-I' of FIG. 1, showing a semiconductor device according to exemplary embodiments of the present inventive concept.
Figure 4B:
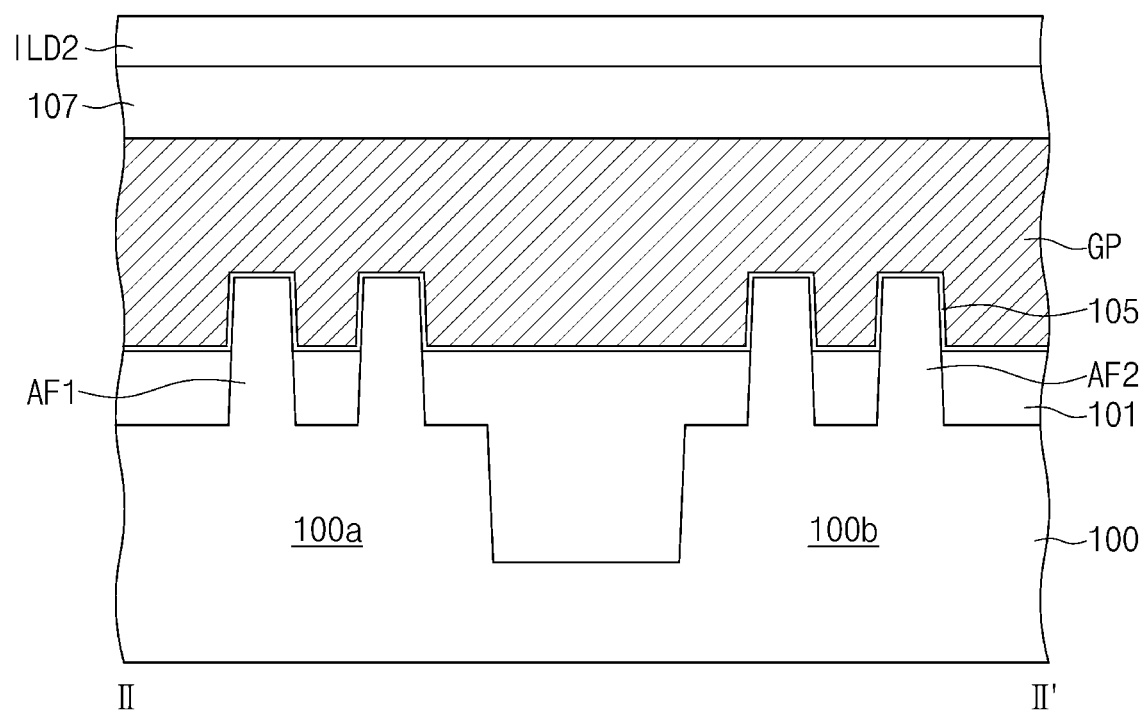
FIG. 4B illustrates a cross-sectional view taken along line II-II' of FIG. 1, showing a semiconductor device according to exemplary embodiments of the present inventive concept.
Figure 4C:
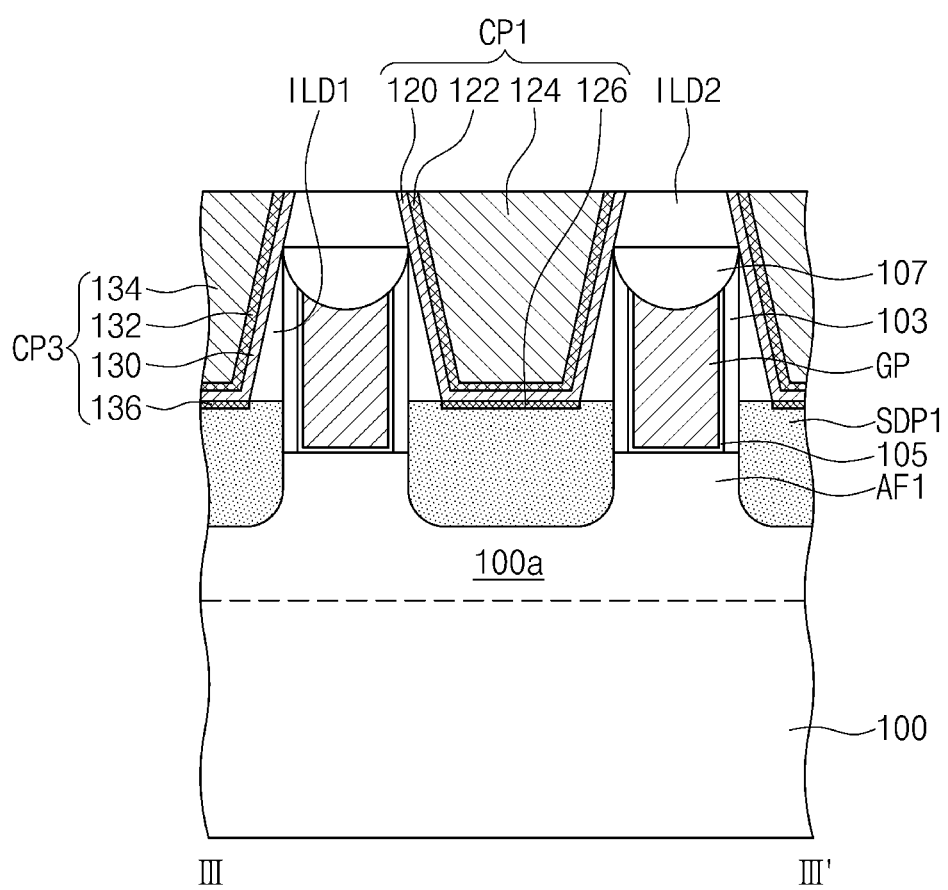
FIG. 4C illustrates a cross-sectional view taken along line III-III' of FIG. 1, showing a semiconductor device according to exemplary embodiments of the present inventive concept.

FIG. 4A illustrates a cross-sectional view taken along line I-I' of FIG. 1, showing a semiconductor device according to exemplary embodiments of the present inventive concept. FIG. 4B illustrates a cross-sectional view taken along line II-II' of FIG. 1, showing a semiconductor device according to exemplary embodiments of the present inventive concept. FIG. 4C illustrates a cross-sectional view taken along line III-III' of FIG. 1, showing a semiconductor device according to exemplary embodiments of the present inventive concept.

Referring to FIGS. 4A, 4B, and 4C, a second distance W2 in the second direction Y between the first barrier pattern 120 of the first contact pattern CP1 and the first barrier pattern 120 of the second contact pattern CP2 may be different from a first distance W1 in the second direction Y between the second barrier pattern 122 of the first contact pattern CP1 and the second barrier pattern 122 of the second contact pattern CP2. For example, the second distance W2 may be less than the first distance W1 (W2<W1). The first and second barrier patterns 120 and 122 may have respective sidewalls S1 and S2 that contact the separation dielectric pattern SP, and the sidewalls S1 and S2 may be misaligned with each other. For example, the sidewall S1 of the first barrier pattern 120 may protrude into the separation dielectric pattern SP. The first barrier pattern 120 may have a top surface whose portion is exposed by the second barrier pattern 122 and covered with the separation dielectric pattern SP.

Figure 5:
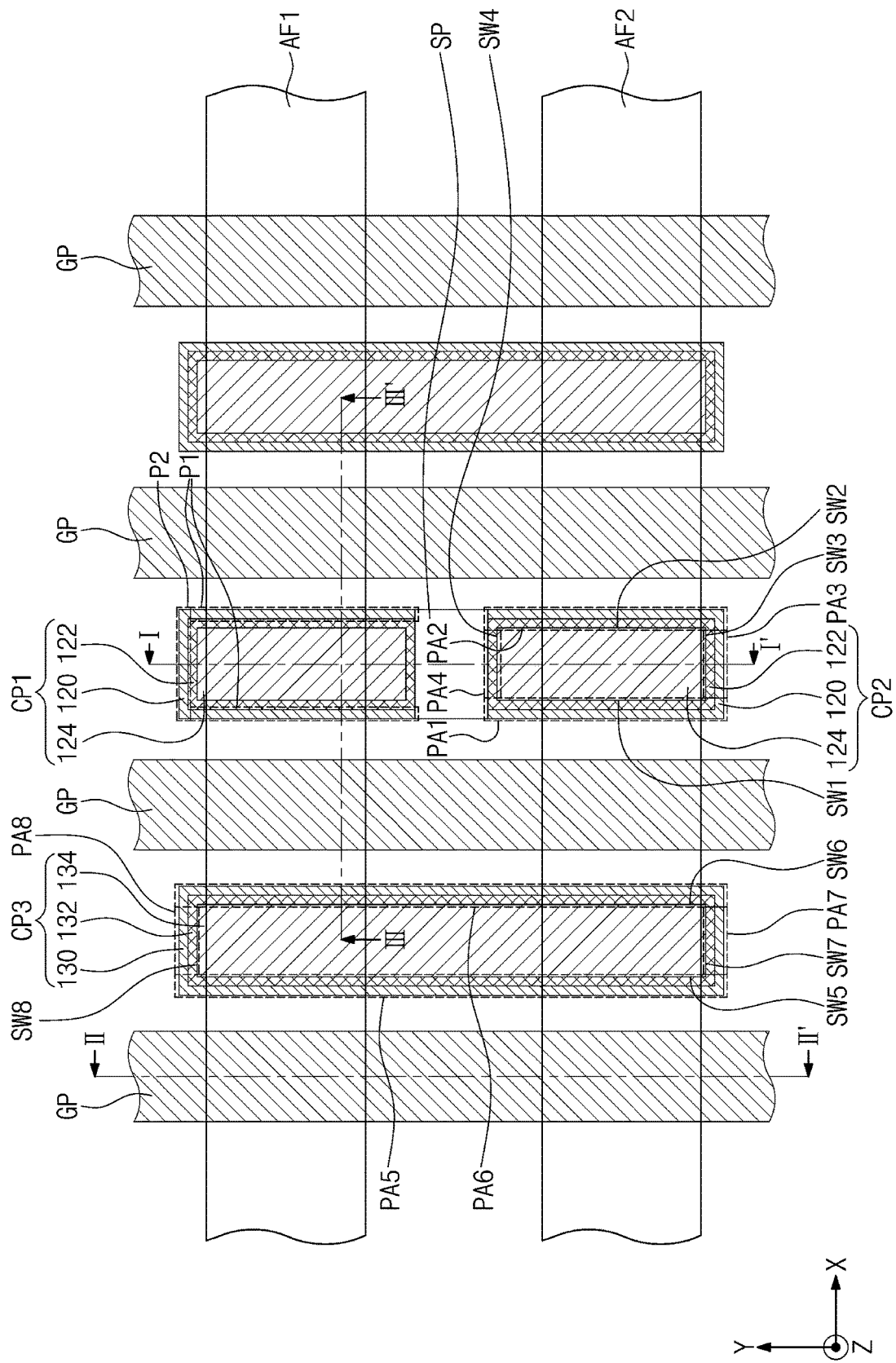
FIG. 5 illustrates a plan view showing a semiconductor device according to exemplary embodiments of the present inventive concept.
Figure 6A:
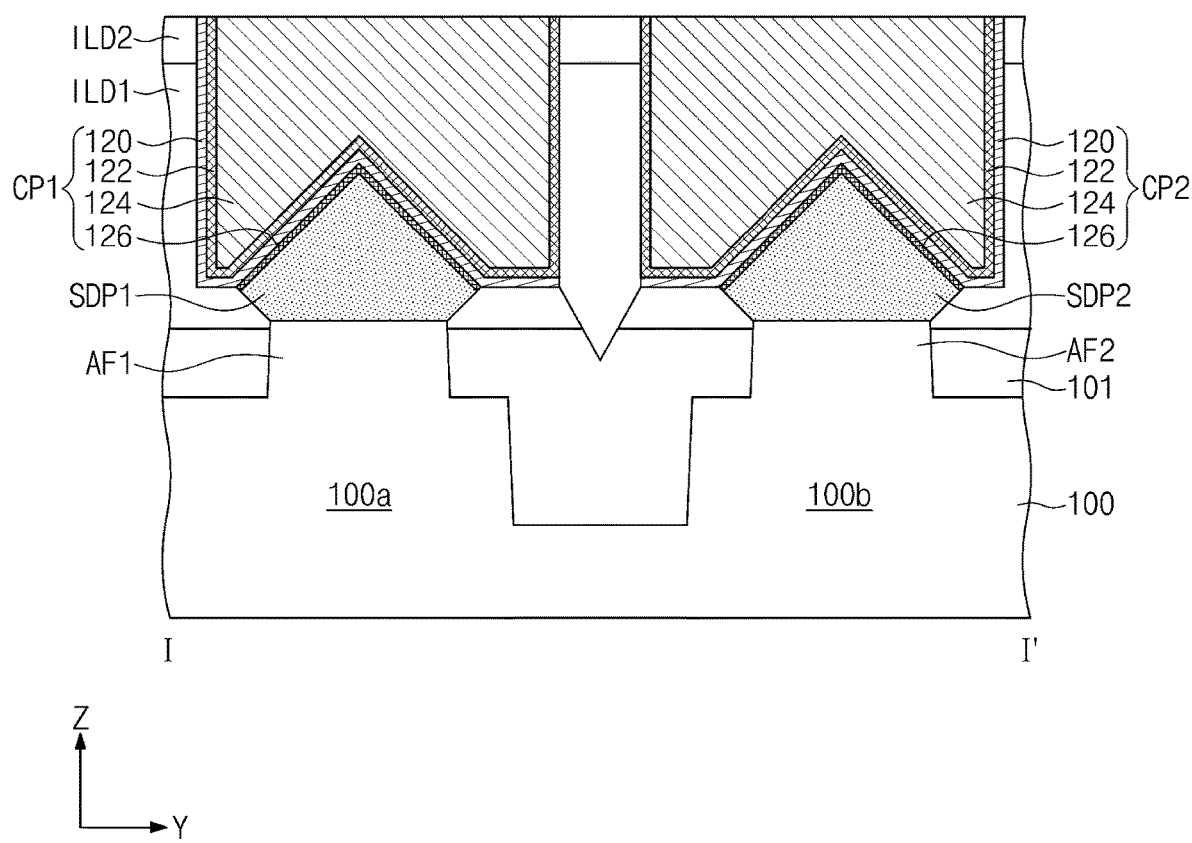
FIG. 6A illustrates a cross-sectional view taken along line I-I' of FIG. 5, showing a semiconductor device according to exemplary embodiments of the present inventive concept.
Figure 6B:
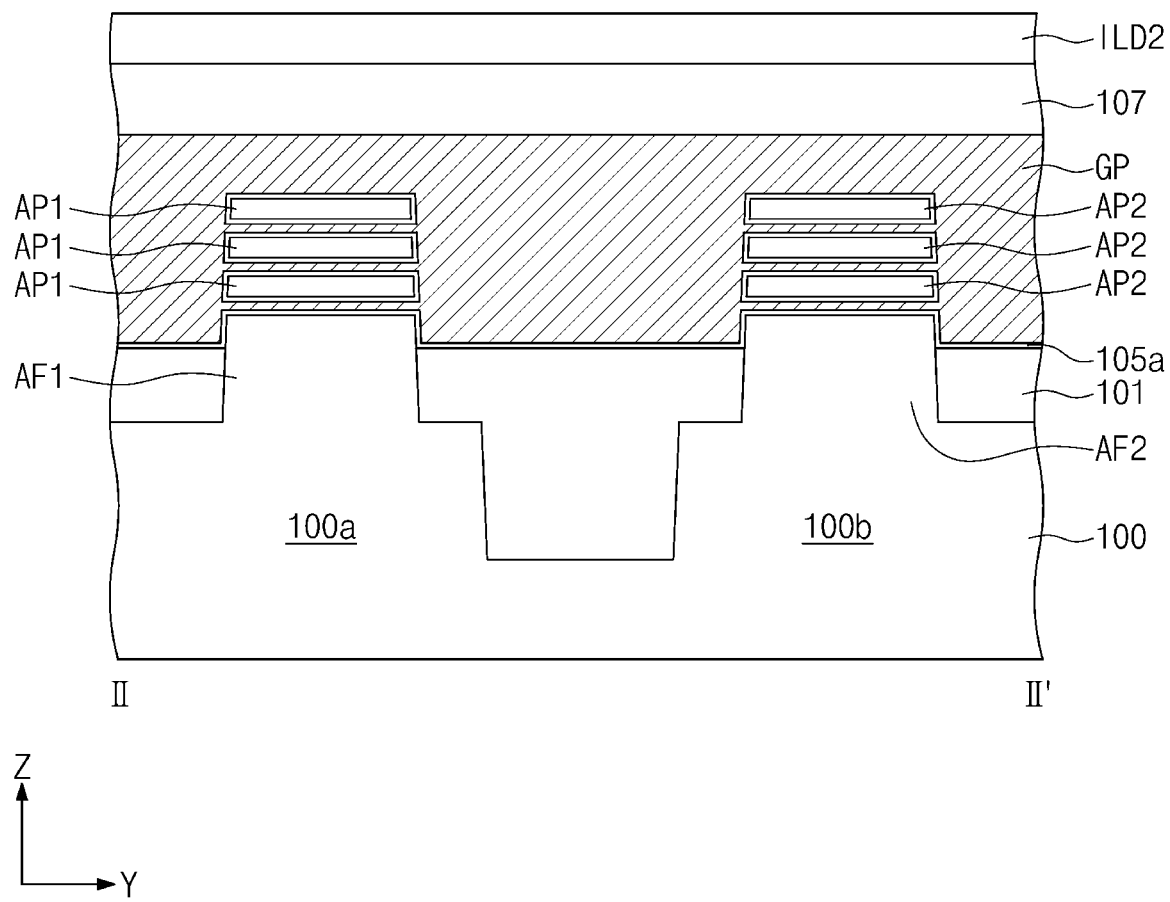
FIG. 6B illustrates a cross-sectional view taken along line I-I' of FIG. 5, showing a semiconductor device according to exemplary embodiments of the present inventive concept.
Figure 6C:
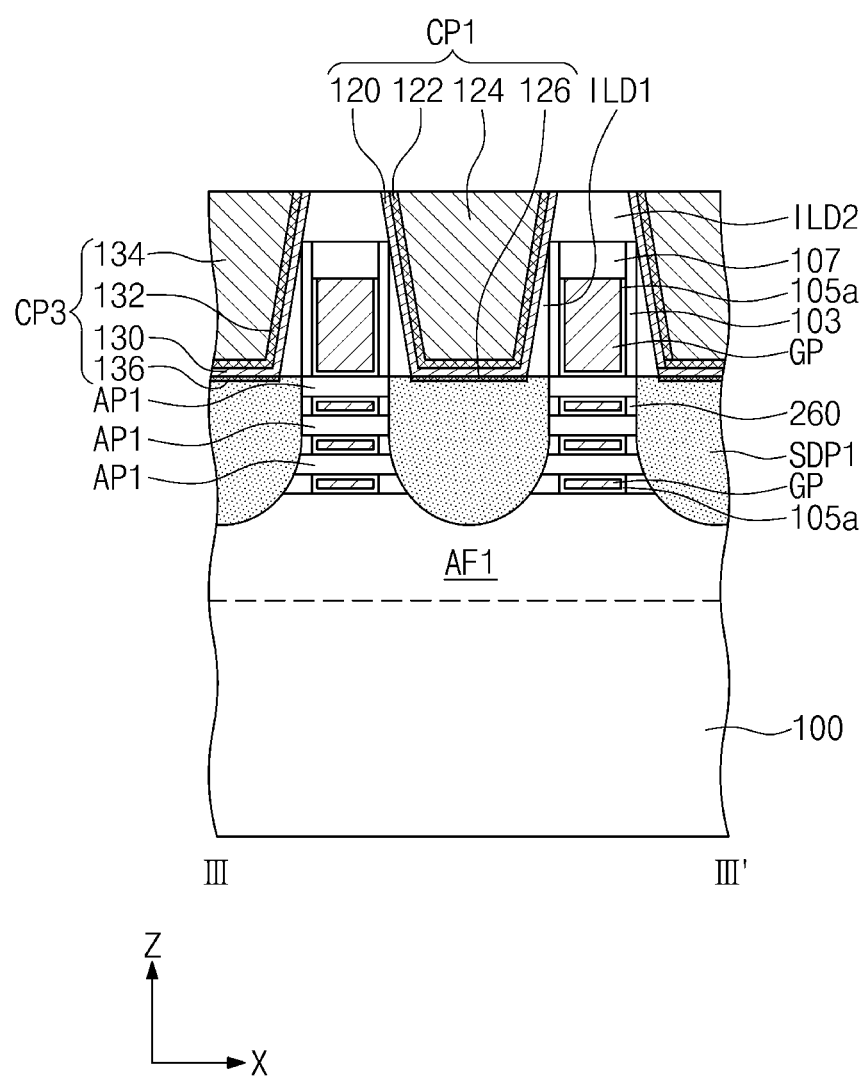
FIG. 6C illustrates a cross-sectional view taken along line III-III' of FIG. 5, showing a semiconductor device according to exemplary embodiments of the present inventive concept.

FIG. 5 illustrates a plan view showing a semiconductor device according to exemplary embodiments of the present inventive concept. FIG. 6A illustrates a cross-sectional view taken along line I-I' of FIG. 5, showing a semiconductor device according to exemplary embodiments of the present inventive concept. FIG. 6B illustrates a cross-sectional view taken along line II-II' of FIG. 5, showing a semiconductor device according to exemplary embodiments of the present inventive concept. FIG. 6C illustrates a cross-sectional view taken along line I-I' of FIG. 5, showing a semiconductor device according to exemplary embodiments of the present inventive concept.

Referring to FIGS. 5, 6A, 6B, and 6C, a first active fin AF1 may be disposed on a first active region 100a of a substrate 100, and a second active fin AF2 may be disposed on a second active region 100b of the substrate 100. The first and second active fins AF1 and AF2 may protrude in a third direction Z from a top surface of the substrate 100. First active patterns AP1 may be spaced apart from each other in the third direction Z on the first active fin AF1, and second active patterns AP2 may be spaced apart from each other in the third direction Z on the second active fin AF2. A gate pattern GP may extend in a second direction Y, and may run across the first active fin AF1 and the second active fin AF2. The gate pattern GP may fill a space between the first active fin AF1 and a lowermost first active pattern AP1, a space between the first active patterns AP1 adjacent to each other in the third direction Z, a space between the second active fin AF2 and a lowermost second active pattern AP2, and a space between the second active patterns AP2 adjacent to each other in the third direction Z. The gate pattern GP may be disposed on an uppermost first active pattern AP1 and an uppermost second active pattern AP2. The gate pattern GP may surround the first active patterns AP1 and the second active patterns AP2. Gate dielectric patterns 105a may be interposed between the gate pattern GP and the first active fin AF1, between the gate pattern GP and the second active fin AF2, between the gate pattern GP and the first active patterns AP1, and between the gate pattern GP and the second active patterns AP2. The gate dielectric patterns 105a may extend between a device isolation layer 101 and the gate pattern GP.

Spacer patterns 260 may be disposed between the first active fin AF1 and the lowermost first active pattern AP1, between the first active patterns AP1 adjacent to each other in the third direction Z, between the second active fin AF2 and the lowermost second active pattern AP2, and between sidewalls of first and second source/drain patterns SDP1 and SDP2 and sidewalls of portions of the gate pattern GP between the second active patterns AP2 adjacent to each other in the third direction Z, for example. The spacer patterns 260 may contact sidewalls of the first and second source/drain patterns SDP1 and SDP2. The spacer patterns 260 may include a dielectric material (e.g., a silicon nitride layer or a silicon oxynitride layer). Gate dielectric patterns 105a may extend between the first active fin AF1 and the lowermost first active pattern AP1, between the first active patterns AP1 adjacent to each other in the third direction Z, between the second active fin AF2 and the lowermost second active pattern AP2, and between sidewalls of the spacer patterns 260 and sidewalls of portions of the gate pattern GP between the second active patterns AP2 adjacent to each other in the third direction Z, for example.

Spacers 103 may be disposed on each of the uppermost first and second active patterns AP1 and AP2 and may cover sidewalls of the gate pattern GP. The spacers 103 may be disposed between the gate pattern GP and a first interlayer dielectric layer ILD1.

Figure 7:
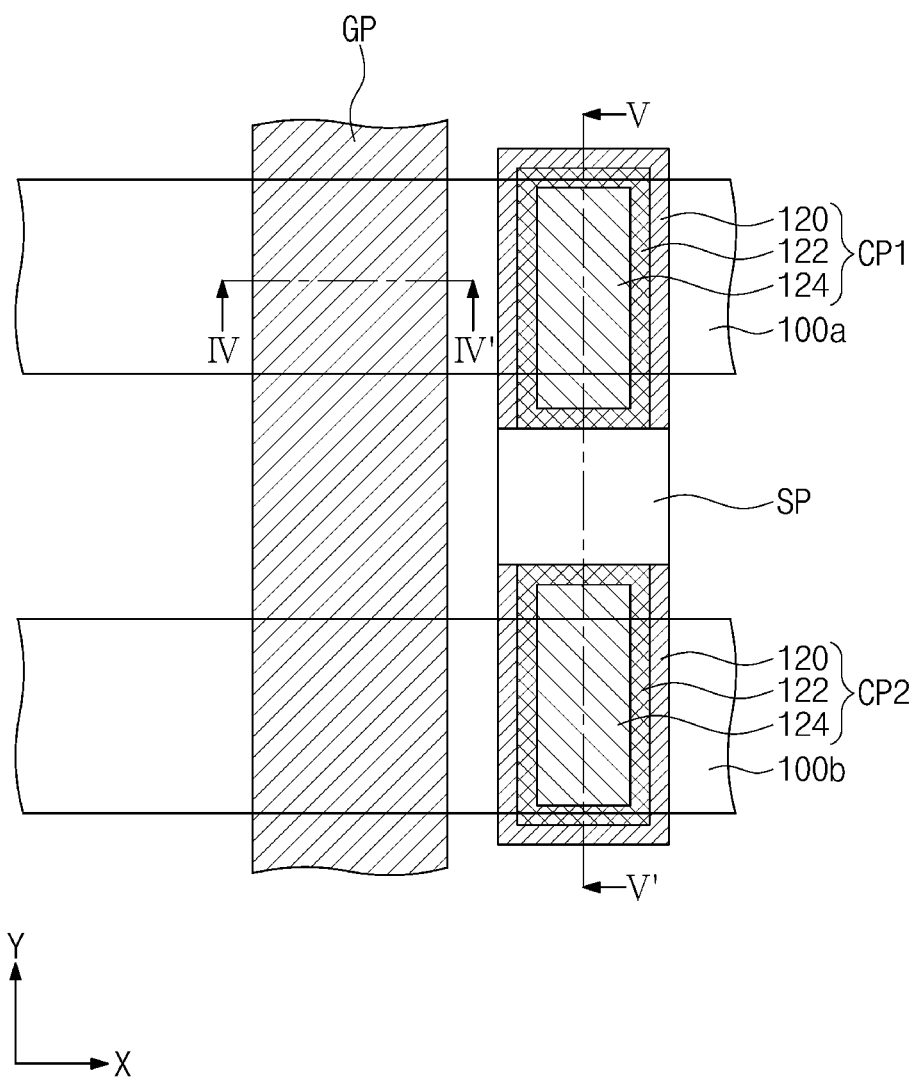
FIG. 7 illustrates a plan view showing a semiconductor device according to exemplary embodiments of the present inventive concept.
Figure 8A:
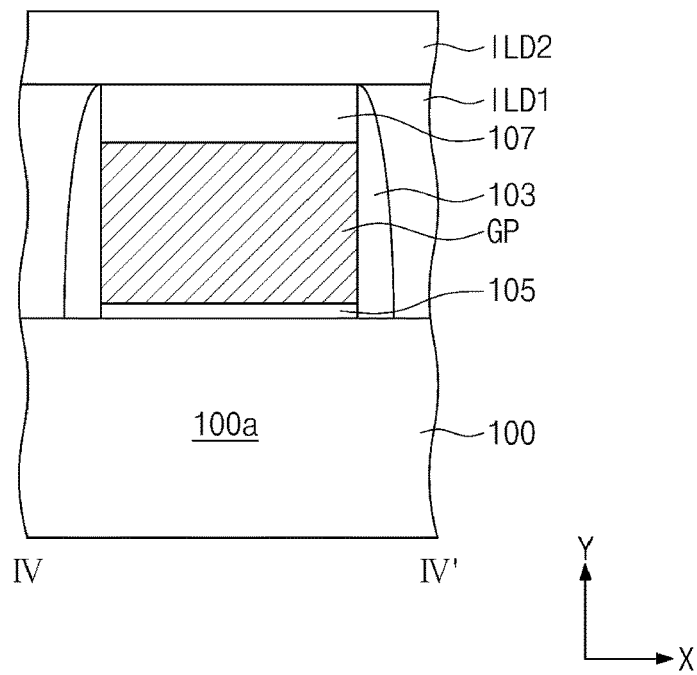
FIG. 8A illustrates a cross-sectional view taken along line IV-IV' of FIG. 7, showing a semiconductor device according to exemplary embodiments of the present inventive concept.
Figure 8B:
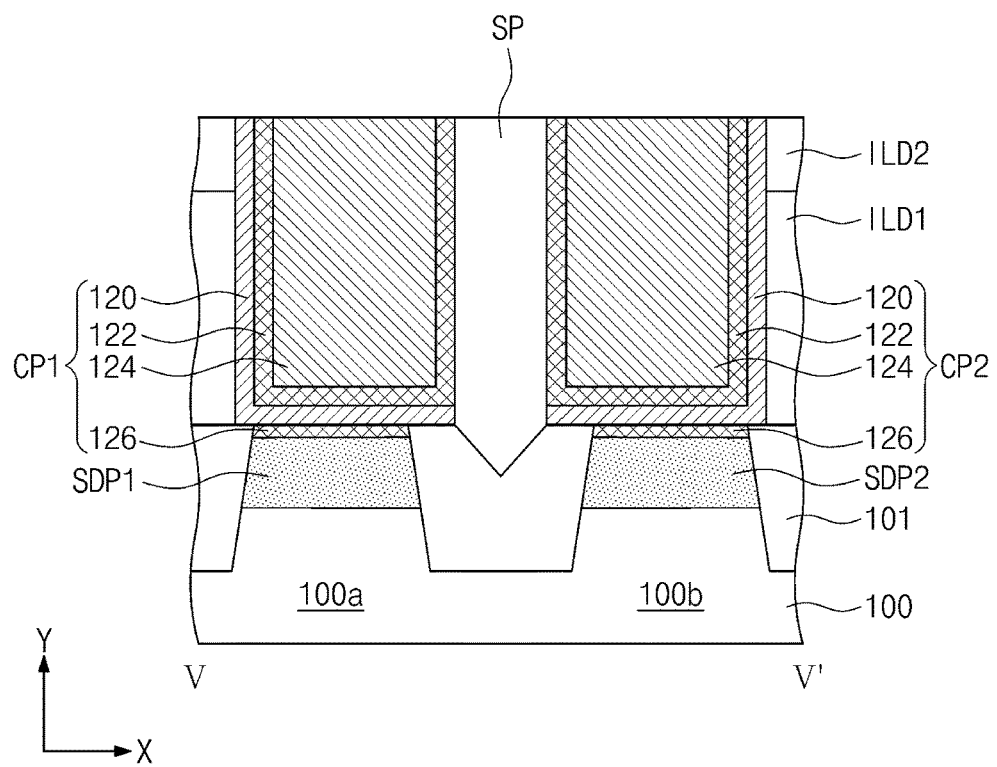
FIG. 8B illustrates a cross-sectional view taken along line V-V' of FIG. 7, showing a semiconductor device according to exemplary embodiments of the present inventive concept.

FIG. 7 illustrates a plan view showing a semiconductor device according to exemplary embodiments of the present inventive concept. FIG. 8A illustrates a cross-sectional view taken along line IV-IV' of FIG. 7, showing a semiconductor device according to exemplary embodiments of the present inventive concept. FIG. 8B illustrates a cross-sectional view taken along line V-V' of FIG. 7, showing a semiconductor device according to exemplary embodiments of the present inventive concept.

Referring to FIGS. 7, 8A, and 8B, a substrate 100 may include a first active region 100a and a second active region 100b that are defined by a device isolation layer 101. The first and second active regions 100a and 100b may be spaced apart from each other in a second direction Y. A gate pattern GP may be disposed on the first and second active regions 100a and 100b. The gate pattern GP may extend in the second direction Y and may run across the first and second active regions 100a and 100b. A gate dielectric layer 105 may be disposed between the gate pattern GP and the first and second active regions 100a and 100b. A capping pattern 107 may be disposed on a top surface of the gate pattern GP. Spacers 103 may cover sidewalls of the gate pattern GP, sidewalls of the gate dielectric layer 105, and sidewalls of the capping pattern 107.

A first source/drain pattern SDP1 may be disposed in or on the first active region 100a exposed by the gate pattern GP. The first source/drain pattern SDP1 may be an epitaxial pattern that is formed by using the substrate 100 as a seed. The first source/drain pattern SDP1 may be an impurity region that is formed by doping the substrate 100 with impurities. A second source/drain pattern SDP2 may be disposed in or on the second active region 100b exposed by the gate pattern GP. The second source/drain pattern SDP2 may be an epitaxial pattern that is formed by using the substrate 100 as a seed. The second source/drain pattern SDP2 may be an impurity region that is formed by doping the substrate 100 with impurities.

A first interlayer dielectric layer ILD1 may be disposed on the substrate 100. The first interlayer dielectric layer ILD1 may cover top surfaces of the first and second source/drain patterns SDP1 and SDP2, a top surface of the device isolation layer 101, and sidewalls of the spacers 103. The first interlayer dielectric layer ILD1 may have a top surface coplanar with that of the capping pattern 107. A second interlayer dielectric layer ILD2 may cover the top surface of the capping pattern 107 and the top surface of the first interlayer dielectric layer ILD1.

A first contact pattern CP1 may penetrate the first and second interlayer dielectric layers ILD1 and ILD2 to come into contact with the top surface of the first source/drain pattern SDP1. A second contact pattern CP2 may penetrate the first and second interlayer dielectric layers ILD1 and ILD2 to come into contact with the top surface of the second source/drain pattern SDP2. The first and second contact patterns CP1 and CP2 may be spaced apart from each other in the second direction Y. Each of the first and second contact patterns CP1 and CP2 may include a first barrier pattern 120, a second barrier pattern 122, a metal pattern 124, and an interfacial pattern 126. A separation dielectric pattern SP may be disposed between the first and second contact patterns CP1 and CP2. The separation dielectric pattern SP may be in direct contact with a side of each of the first and second contact patterns CP1 and CP2. A description of the first contact pattern CP1, the second contact pattern CP2, and the separation dielectric pattern SP is the same as those discussed above with reference to FIGS. 1, 2A, 2B, and 2C, and thus will be omitted.

FIGS. 9A to 15A, 16, 17A, and 18A illustrate cross-sectional views taken along line I-I' of FIG. 1, showing a method of fabricating a semiconductor device according to exemplary embodiments of the present inventive concept. FIGS. 9B to 15B, 17B, and 18B illustrate cross-sectional views taken along line II-II' of FIG. 1, showing a method of fabricating a semiconductor device according to exemplary embodiments of the present inventive concept. FIGS. 9C to 15C, 17C, and 18C illustrate cross-sectional views taken along line III-III' of FIG. 1, showing a method of fabricating a semiconductor device according to exemplary embodiments of the present inventive concept.

Figure 9A:
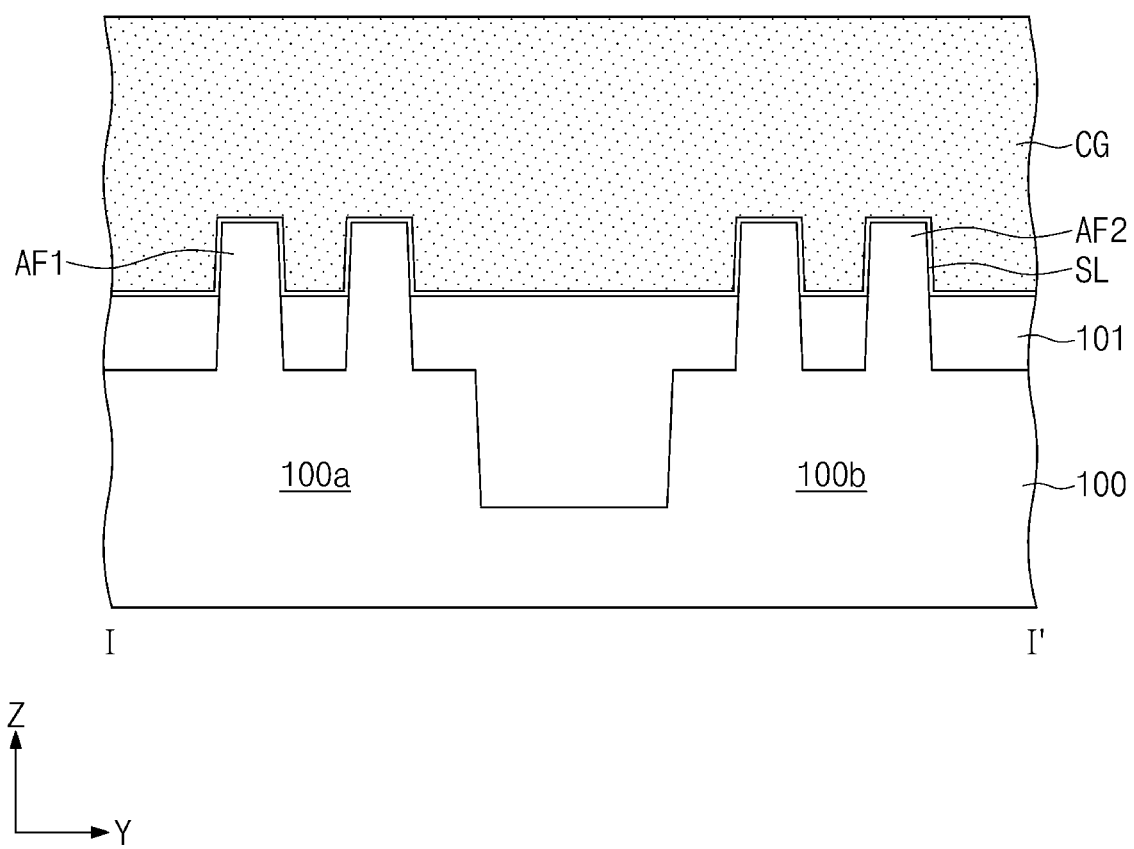
FIGS. 9A, 10A, 11A, 12A, 13A, 14A, 15A, 16, 17A, and 18A illustrate cross-sectional views taken along line I-I' of FIG. 1, showing a method of fabricating a semiconductor device according to exemplary embodiments of the present inventive concept.
Figure 9B:
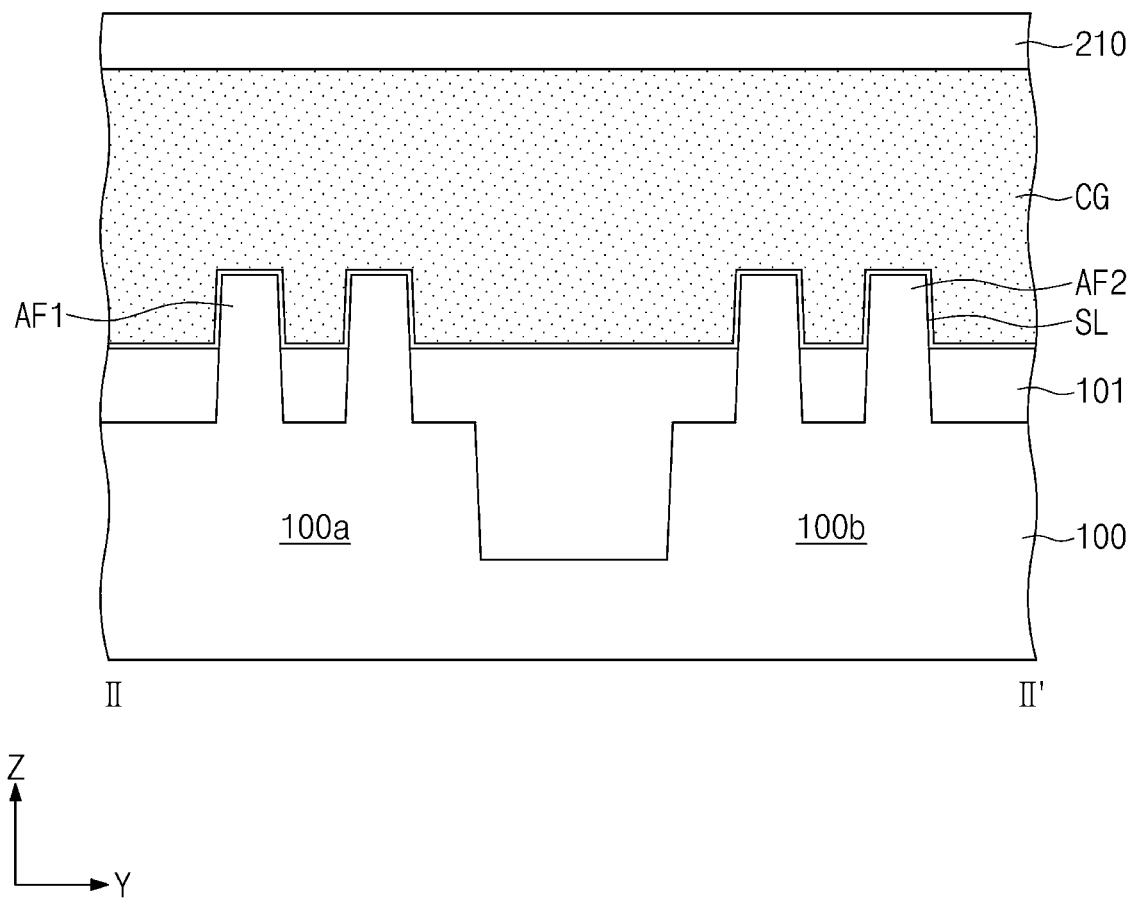
FIGS. 9B, 10B, 11B, 12B, 13B, 14B, 15B, 17B, and 18B illustrate cross-sectional views taken along line II-II' of FIG. 1, showing a method of fabricating a semiconductor device according to exemplary embodiments of the present inventive concept.
Figure 9C:
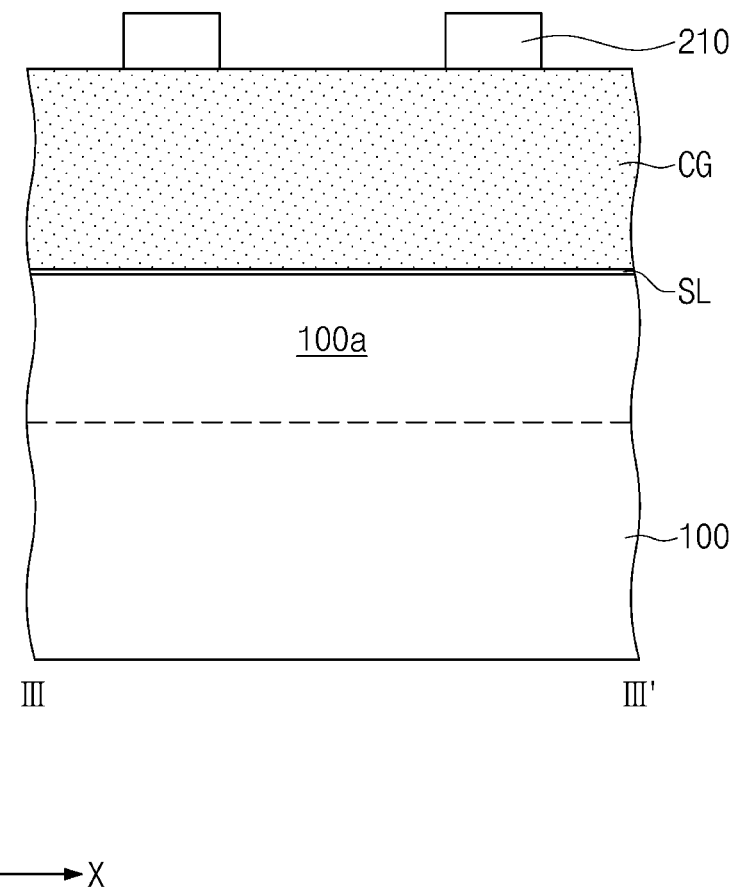
FIGS. 9C, 10C, 11C, 12C, 13C, 14C, 15C, 17C, and 18C illustrate cross-sectional views taken along line III-III' of FIG. 1, showing a method of fabricating a semiconductor device according to exemplary embodiments of the present inventive concept.

Referring to FIGS. 9A, 9B, and 9C, a device isolation layer 101 may be formed in a substrate 100. The device isolation layer 101 may be formed by etching an upper portion of the substrate 100 to form a trench and then filling the trench with a dielectric material (e.g., silicon oxide). The device isolation layer 101 may define a first active region 100a and a second active region 100b of the substrate 100. The first and second active regions 100a and 100b may be spaced apart from each other in a second direction Y. First active fins AF1 may be formed on the first active region 100a, and second active fins AF2 may be formed on the second active region 100b. The first and second active fins AF1 and AF2 may protrude in a third direction Z from a top surface of the substrate 100. The device isolation layer 101 may expose upper sidewalls and top surfaces of the first and second active fins AF1 and AF2.

A sacrificial dielectric layer SL may cover the top surfaces and sidewalls of the first and second active fins AF1 and AF2 exposed by the device isolation layer 101. The sacrificial dielectric layer SL may conformally cover the top surface and sidewalls of the first and second active fins AF1 and AF2. The sacrificial layer SL may include an oxide layer or a nitride layer.

A sacrificial gate layer CG may be formed on the sacrificial dielectric layer SL. The sacrificial gate layer CG may cover a top surface of the sacrificial dielectric layer SL. The sacrificial gate layer CG may fill gaps between the first active fins AF1 and the second active fins AF2. The sacrificial gate layer CG may include at least one layer having an etch selectivity with respect to the sacrificial dielectric layer SL. The sacrificial gate layer CG may include, for example, polysilicon.

First mask patterns 210 may be formed on the sacrificial gate layer CG. The first mask patterns 210 may be spaced apart from each other in a first direction X on the sacrificial gate layer CG, and may extend in a second direction Y. The first mask patterns 210 may occupy areas where the gate patterns GP discussed above with reference to FIG. 1 are to be disposed. The first mask patterns 210 may include a silicon oxide layer or a silicon nitride layer.

Figure 10A:
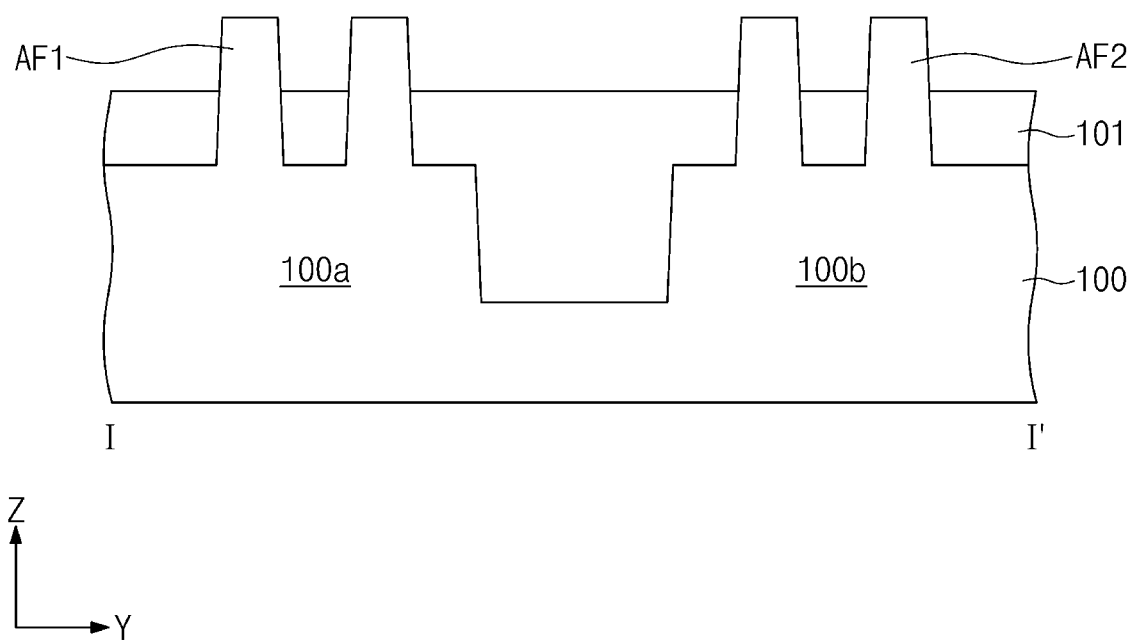
Figure 10B:
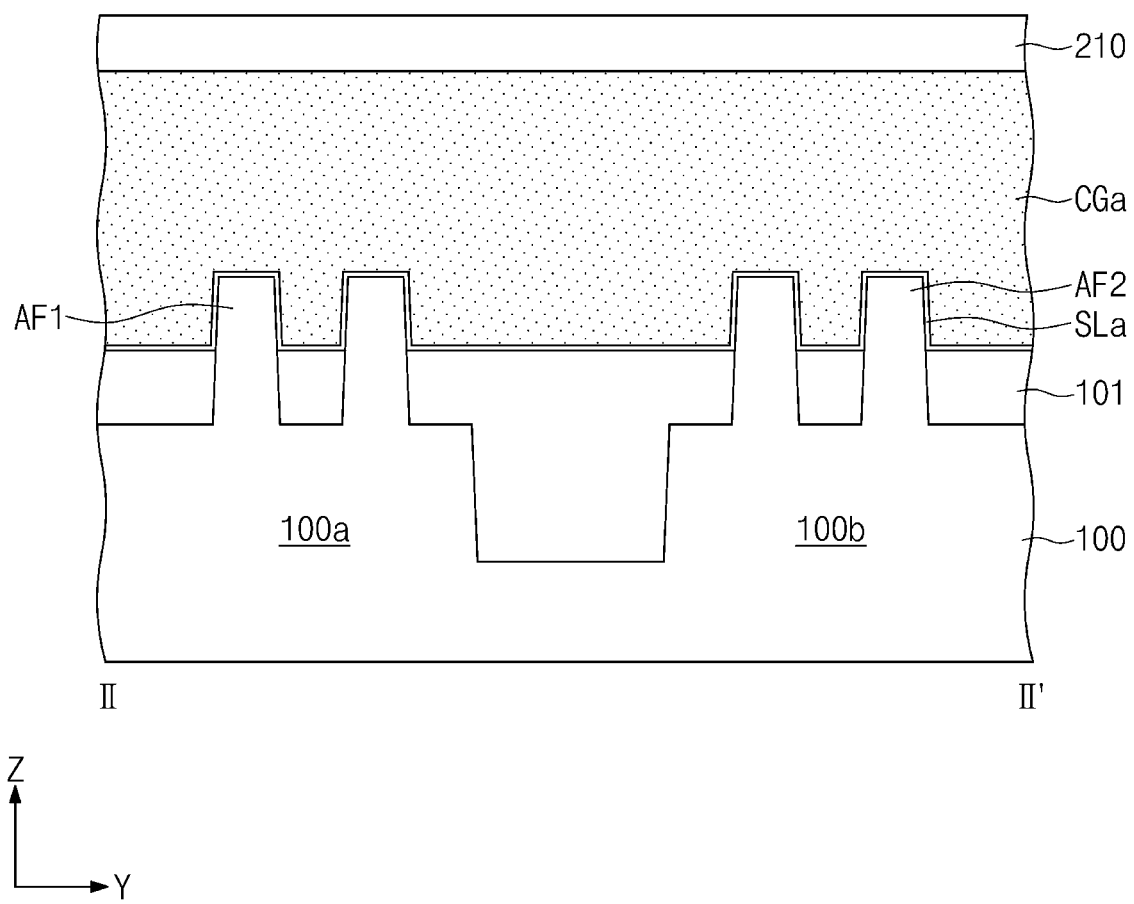
Figure 10C:
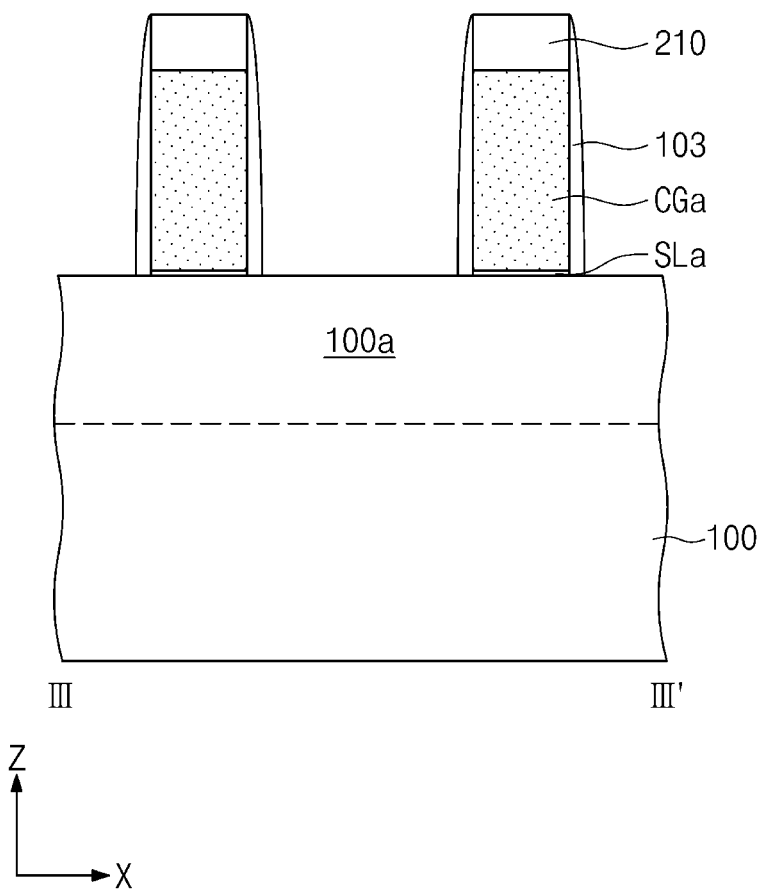

Referring to FIGS. 10A, 10B, and 10C, a patterning process may be performed in which the first mask patterns 210 may be used to sequentially pattern the sacrificial gate layer CG and the sacrificial dielectric layer SL. Therefore, sacrificial dielectric patterns SLa and sacrificial gate patterns CGa may be sequentially formed on the substrate 100. The patterning process may be performed using wet etching or dry etching. The sacrificial dielectric patterns SLa, the sacrificial gate patterns CGa, and the first mask patterns 210 may be arranged in the first direction X on the substrate 100, and may extend in the second direction Y. The sacrificial dielectric patterns SLa, the sacrificial gate patterns CGa, and the first mask patterns 210 may expose a top surface of the device isolation layer 101 between the first mask patterns 210 and also expose portions of the first and second active fins AF1 and AF2 between the first mask patterns 210.

Spacers 103 may be formed on sidewalls of the sacrificial dielectric patterns SLa, sidewalls of the sacrificial gate patterns CGa, and sidewalls of the first mask patterns 210. The spacers 103 may be formed by forming and etching a dielectric layer that conformally covers top surfaces of the first mask patterns 210, the sidewalls of the sacrificial dielectric patterns SLa, the sidewalls of the sacrificial gate patterns CGa, and the sidewalls of the first mask patterns 210. The spacers 103 may expose the top surfaces of the first mask patterns 210. The spacers 103 may include a dielectric material (e.g., a silicon oxide layer or a silicon nitride layer).

Figure 11A:
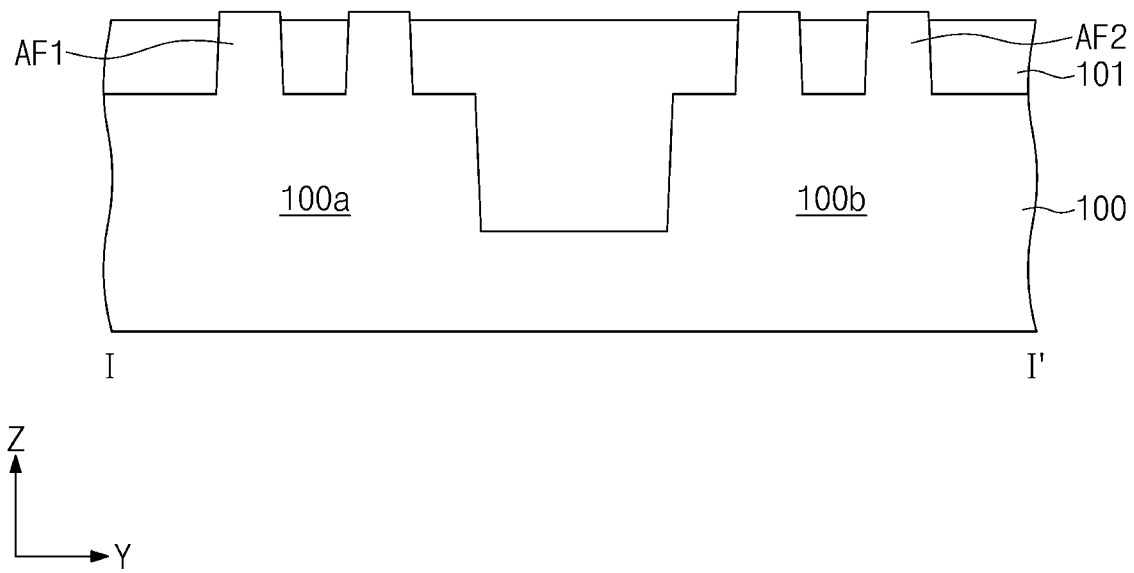
Figure 11B:
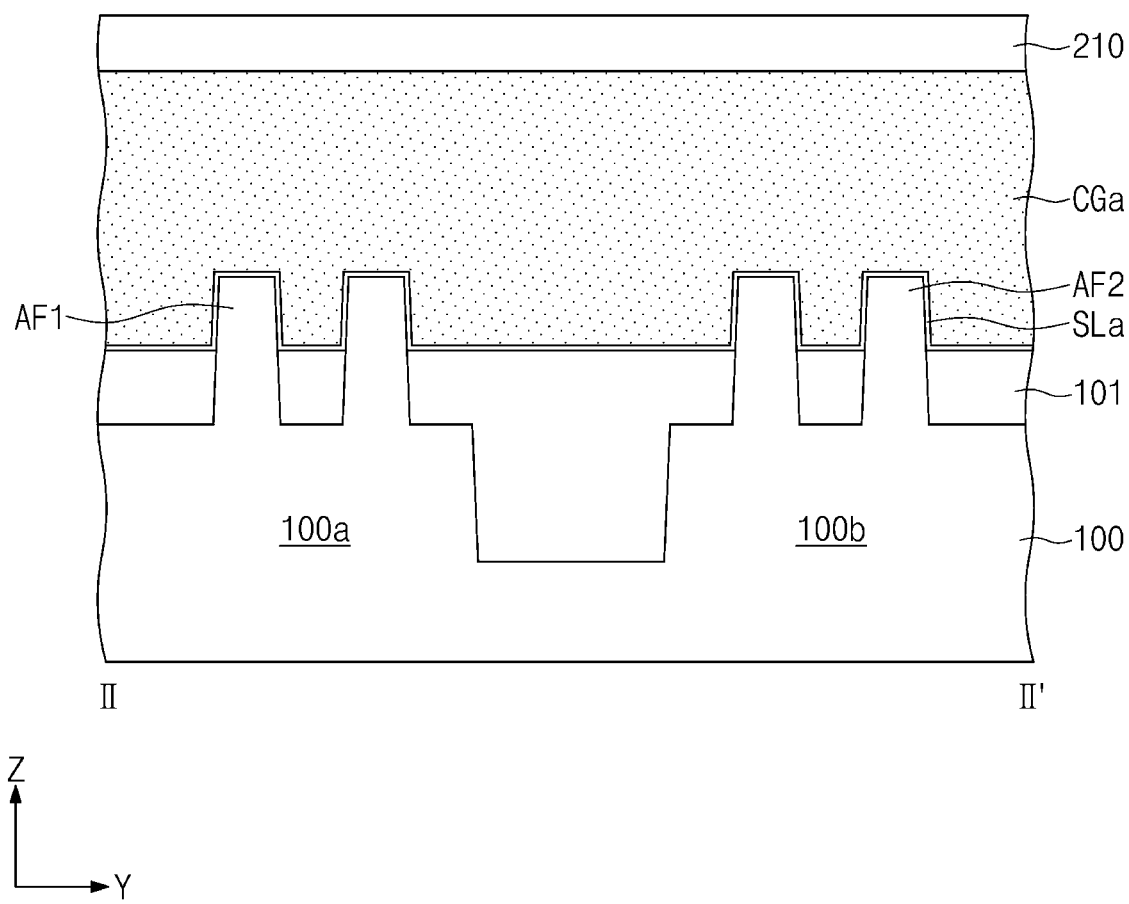
Figure 11C:
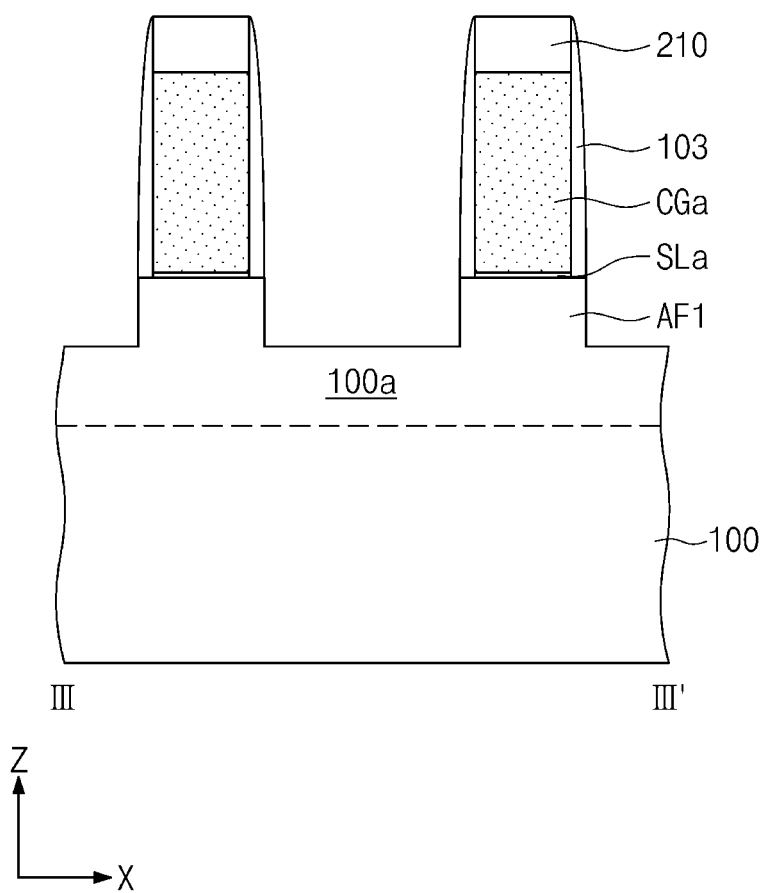

Referring to FIGS. 11A, 11B, and 11C, an etching process may be performed to etch portions of the first and second active fins AF1 and AF2 exposed by the sacrificial dielectric patterns SLa, the sacrificial gate patterns CGa, the first mask patterns 210, and the spacers 103. Therefore, top surfaces of the first and second active fins AF1 and AF2 disposed between the first mask patterns 210 may be recessed from top surfaces of the first and second active fins AF1 and AF2 disposed below the sacrificial dielectric patterns SLa. The etching process may be performed by employing dry etching.

Figure 12A:
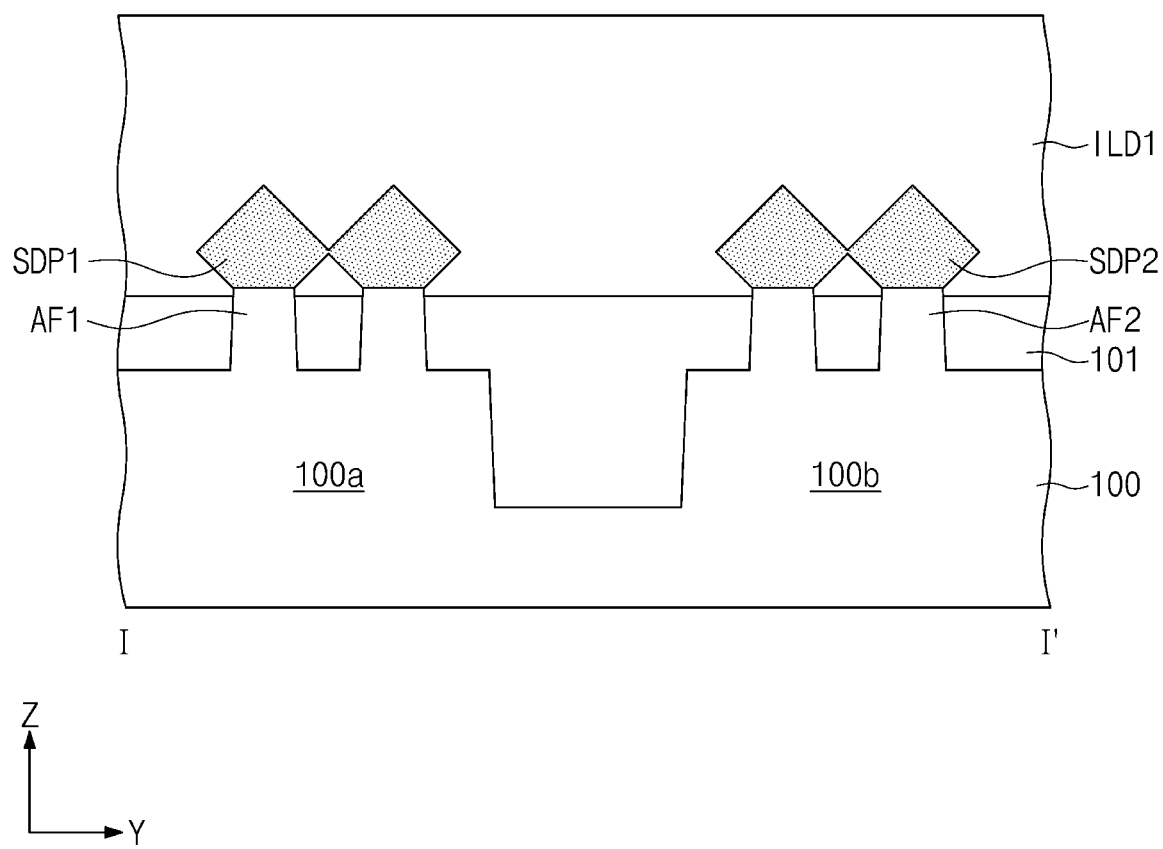
Figure 12B:
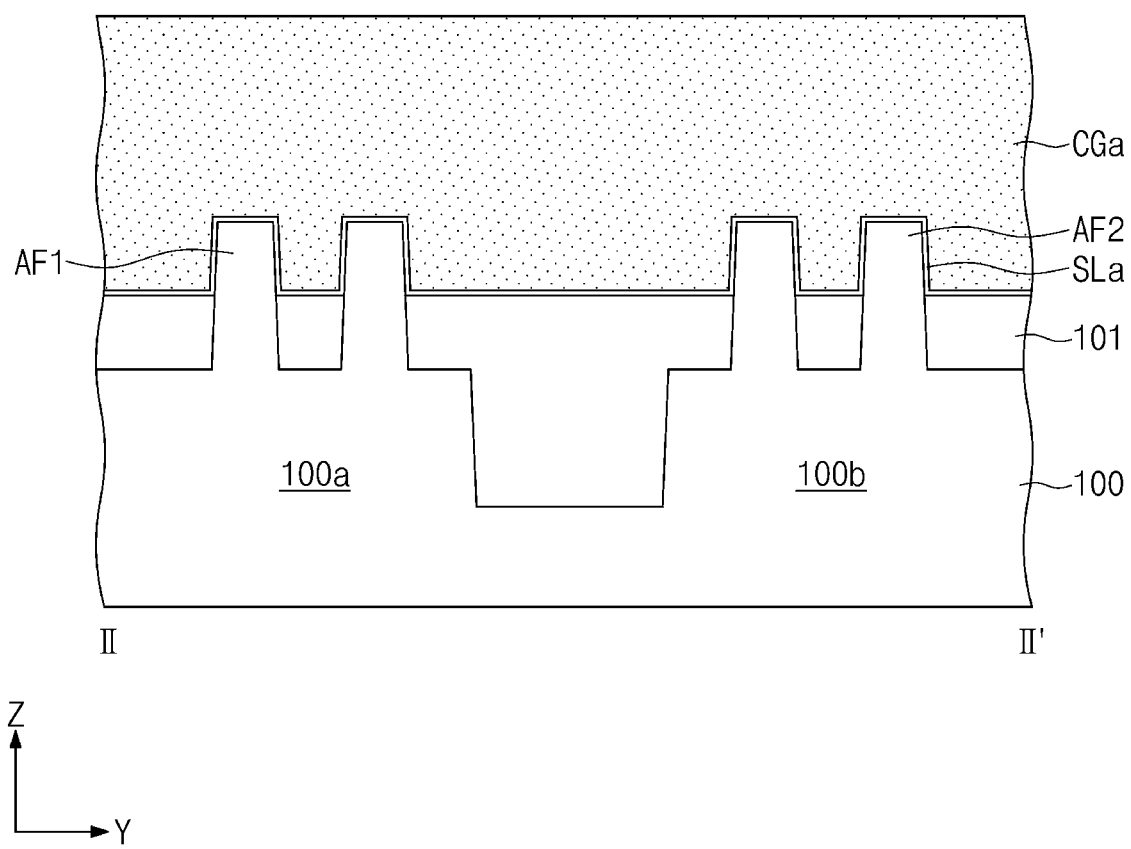
Figure 12C:
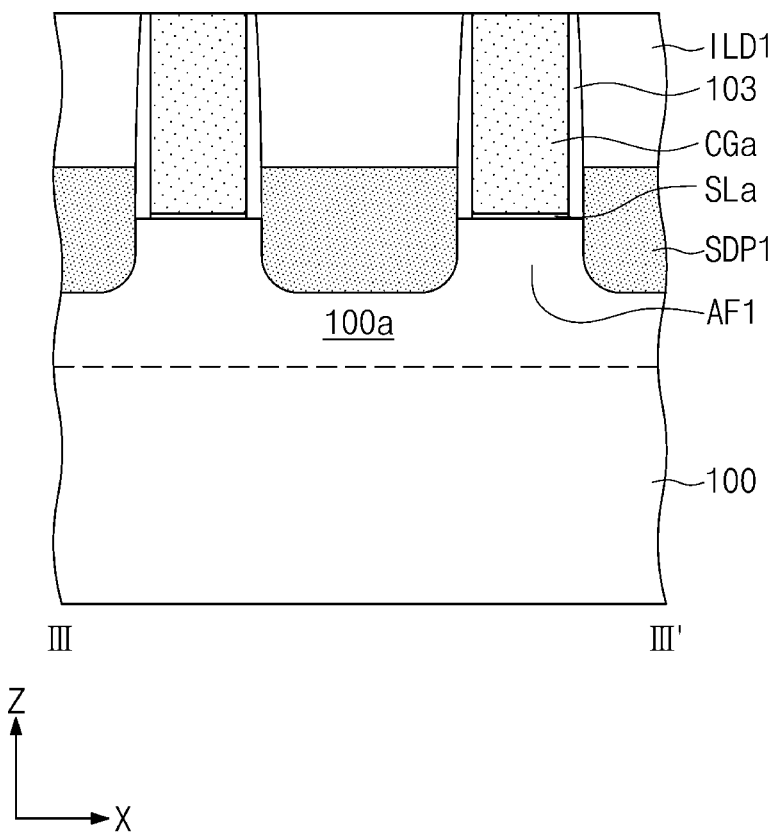

Referring to FIGS. 12A, 12B, and 12C, a first source/drain pattern SDP1 may be formed on the first active fins AF1 exposed by the first mask patterns 210, and a second source/drain pattern SDP2 may be formed on the second active fins AF2 exposed by the first mask patterns 210. The first source/drain pattern SDP1 may be formed by performing an epitaxial growth process in which portions of the first active fins AF1 are used as a seed exposed by the device isolation layer 101 and the first mask patterns 210 on the first active region 100a. For example, the first source/drain pattern SDP1 may be an epitaxial layer grown from portions of the first active fins AF1. The first source/drain pattern SDP1 may be a single pattern in which are merged a plurality of epitaxial patterns formed on portions of the first active fins AF1 exposed by the device isolation layer 101 and the first mask patterns 210 on the first active region 100a. The epitaxial patterns may have pentagonal shapes, and the first source/drain pattern SDP1 may have a shape in which the pentagonal epitaxial patterns are merged with each other in the second direction Y. For example, the first source/drain pattern SDP1 may have a top surface at a higher level than those of the top surfaces of the first active fins AF1 disposed below the sacrificial dielectric patterns SLa. As another example, as shown in FIG. 3, the first source/drain pattern SDP1 may have a top surface coplanar with those of the first active fins AF1 disposed below the sacrificial dielectric patterns SLa. The first source/drain pattern SDP1 may fill recess regions of the substrate 100 between the first mask patterns 210 on the first active region 100a of the substrate 100.

A second source/drain pattern SDP2 may be formed by performing an epitaxial growth process in which portions of the second active fins AF2 are used a seed exposed by the device isolation layer 101 and the first mask patterns 210 on the second active region 100b of the substrate 100. For example, the second source/drain pattern SDP2 may be an epitaxial layer grown from portions of the second active fins AF2. The second source/drain pattern SDP2 may be a single pattern in which are merged a plurality of epitaxial patterns formed on portions of the second active fins AF2 exposed by the device isolation layer 101 and the first mask patterns 210 on the second active region 100b. The epitaxial patterns may have pentagonal shapes, and the second source/drain pattern SDP2 may have a shape in which the pentagonal epitaxial patterns are merged with each other in the second direction Y. For example, the second source/drain pattern SDP2 may have a top surface at a higher level than those of the top surfaces of the second active fins AF2 disposed below the sacrificial dielectric patterns SLa. As another example, the second source/drain pattern SDP2 may have a top surface coplanar with those of the second active fins AF2 disposed below the sacrificial dielectric patterns SLa. The second source/drain pattern SDP2 may fill recess regions of the substrate 100 between the first mask patterns 210 on the second active region 100b. The first and second source/drain patterns SDP1 and SDP2 may be formed simultaneously with each other. A gap may be formed between the first and second source/drain patterns SDP1 and SDP2 in the second direction Y.

A first interlayer dielectric layer ILD1 may be formed on the first and second source/drain patterns SDP1 and SDP2. The first interlayer dielectric layer ILD1 may fill spaces between the first mask patterns 210 and may cover the top surfaces of the first mask patterns 210. The first interlayer dielectric layer ILD1 may include a dielectric material (e.g., a silicon oxide layer or a silicon nitride layer).

An etching process may be performed such that the first interlayer dielectric layer ILD1 and the first mask patterns 210 are etched until top surfaces of the sacrificial gate patterns CGa are exposed. Accordingly, the sacrificial gate patterns CGa may be exposed at their top surfaces, and the spacers 103 may also be exposed at their top surfaces. The top surfaces of the sacrificial gate patterns CGa may be coplanar with the top surfaces of the spacers 103 and the top surface of the first interlayer dielectric layer ILD1. A chemical mechanical polishing process may be employed as the etching process.

Figure 13A:
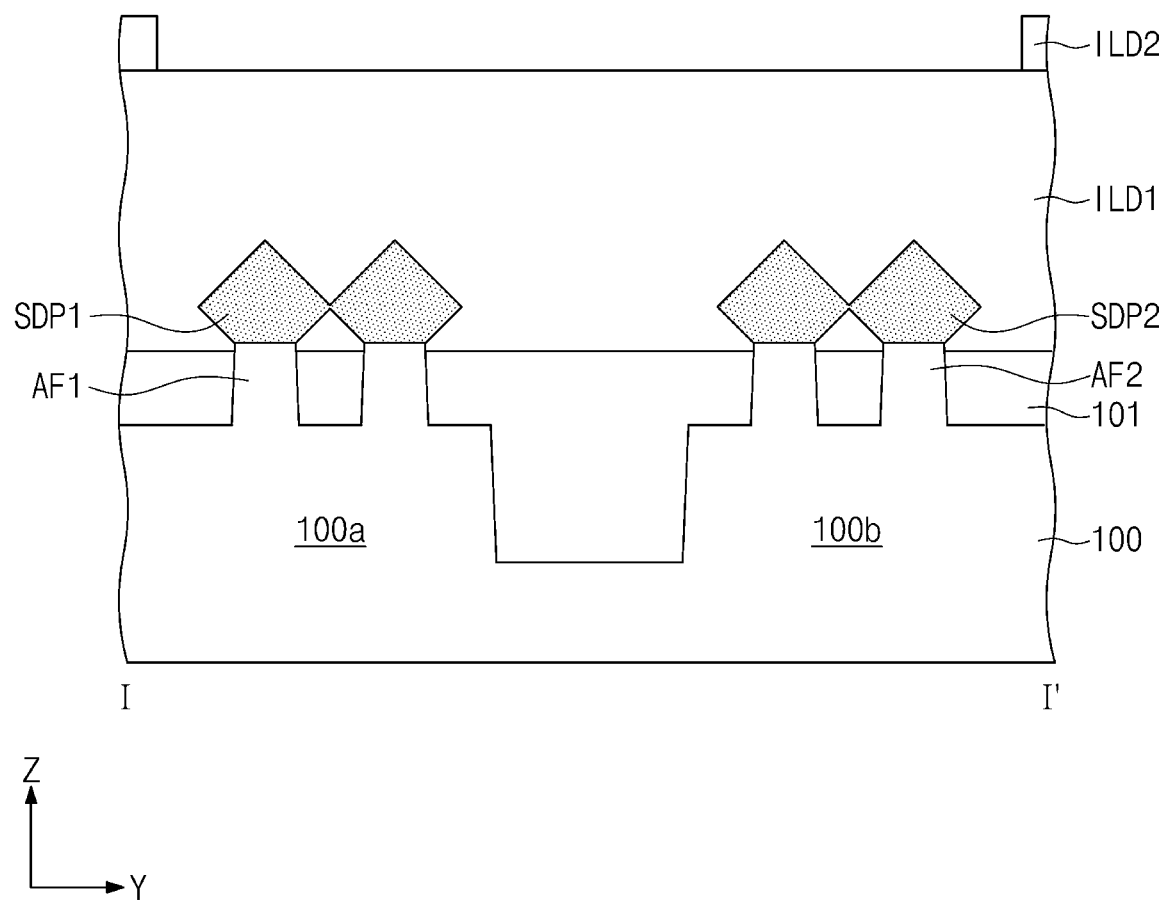
Figure 13B:
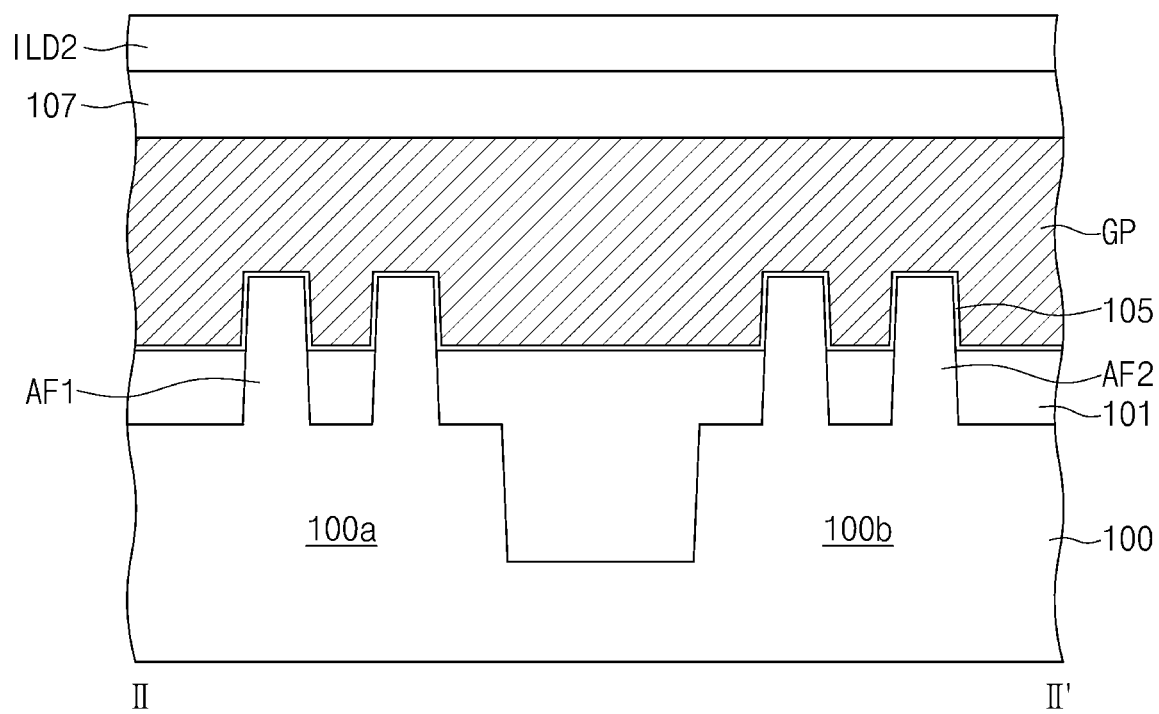
Figure 13C:
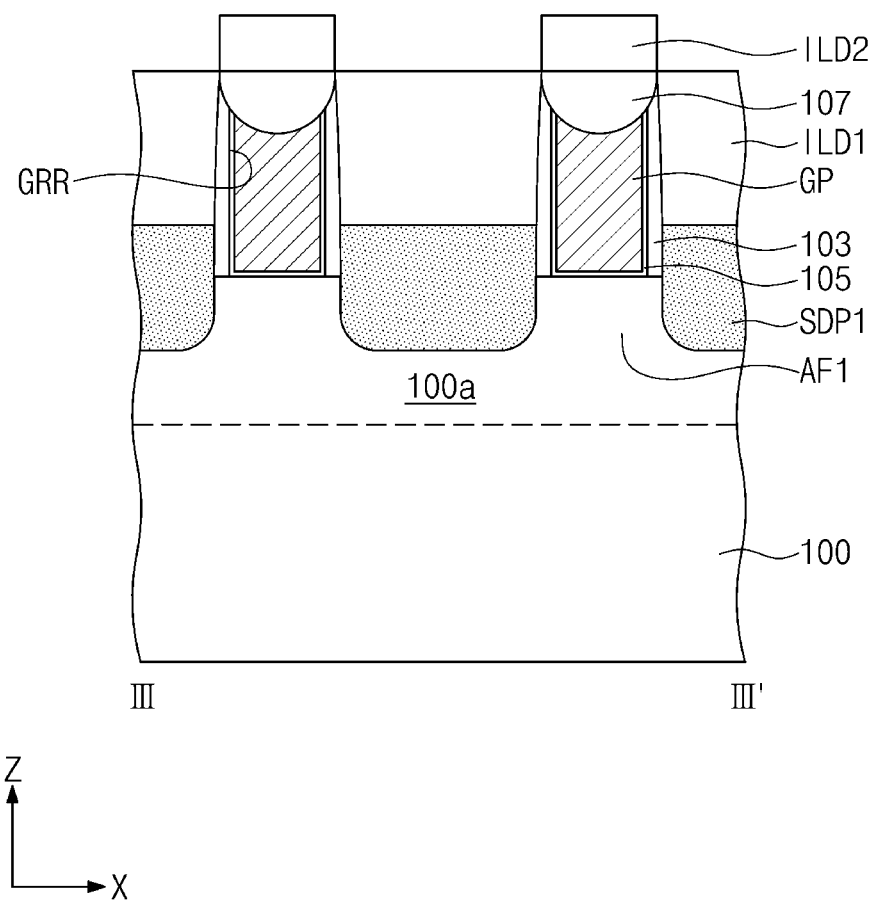

Referring to FIGS. 13A, 13, and 13C, gate recess regions GRR may be formed by removing the sacrificial dielectric patterns SLa and the sacrificial gate patterns CGa exposed by the first interlayer dielectric layer ILD1. The gate recess regions GRR may partially expose the first active fins AF1 between the first source/drain patterns SDP1 adjacent to each other in the first direction X and also expose the second active fins AF2 between the second source/drain patterns SDP2 adjacent to each other in the first direction X. The gate recess regions GRR may expose inner sidewalls of the spacers 103. The sacrificial dielectric patterns SLa and the sacrificial gate patterns CGa may be selectively removed using an etch recipe that has an etch selectivity with respect to the spacers 103 and the substrate 100.

A gate dielectric layer 105 may conformally cover the top surfaces and sidewalls of the first active fins AF1 exposed to the gate recess regions GRR, the top surfaces and sidewalls of the second active fins AF2 exposed to the gate recess regions GRR, and the inner sidewalls of the spacers 103 exposed to the gate recess regions GRR. The gate dielectric layer 105 may include, for example, a silicon oxide layer or a high-k dielectric layer (e.g., $HfO_2$, HfSiO, HfSiON, HfON, HfAlO, HfLaO, or $TaO_2$).

Gate patterns GP may be formed in the gate recess regions GRR in which the gate dielectric layers 105 are formed. The gate patterns GP may be formed by forming a metal layer to fill the gate recess regions GRR and to cover the top surface of the first interlayer dielectric layer ILD1, and performing an etching process until top surfaces of the gate patterns GP are recessed from the top surface of the first interlayer dielectric layer ILD1. In other words, the top surfaces of the gate patterns GP are located below the top surface of the first interlayer dielectric layer ILD1. Upper portions of the spacers 103 and an upper portion of the gate dielectric layer 105 may be etched when the gate patterns GP are etched. The etching process may be performed by employing wet etching or dry etching. The gate patterns GP may include one or more of a metal nitride material (e.g., TiN, TaN, AlN, WN, or MoN), metal (e.g., W, Al, or Cu), and semiconductor materials (e.g., Si).

Capping patterns 107 may be disposed on the top surfaces of the gate patterns GP, the top surfaces of the spacers 103, and a top surface of the gate dielectric layer 105. The capping patterns 107 may fill upper portions of the gate recess regions GRR. The capping patterns 107 may be formed by forming a dielectric layer to fill upper portions of the gate recess regions GRR and to cover the top surface of the first interlayer dielectric layer ILD1, and performing an etching process until the top surface of the first interlayer dielectric layer ILD1 is exposed. The etching process that forms the capping patterns 107 may be performed by employing chemical mechanical polishing or dry etching. The capping patterns 107 may include a dielectric material (e.g., a silicon nitride layer or a silicon oxide layer).

A second interlayer dielectric layer ILD2 may be formed on the capping patterns 107. The second interlayer dielectric layer ILD2 may expose the top surface of the first interlayer dielectric layer ILD1 formed on the top surfaces of the first and second source/drain patterns SDP1 and SDP2. The second interlayer dielectric layer ILD2 may be formed extending in the second direction Y on the top surfaces of the capping patterns 107. The second interlayer dielectric layer ILD2 may include a dielectric material (e.g., a silicon oxide layer).

Figure 14A:
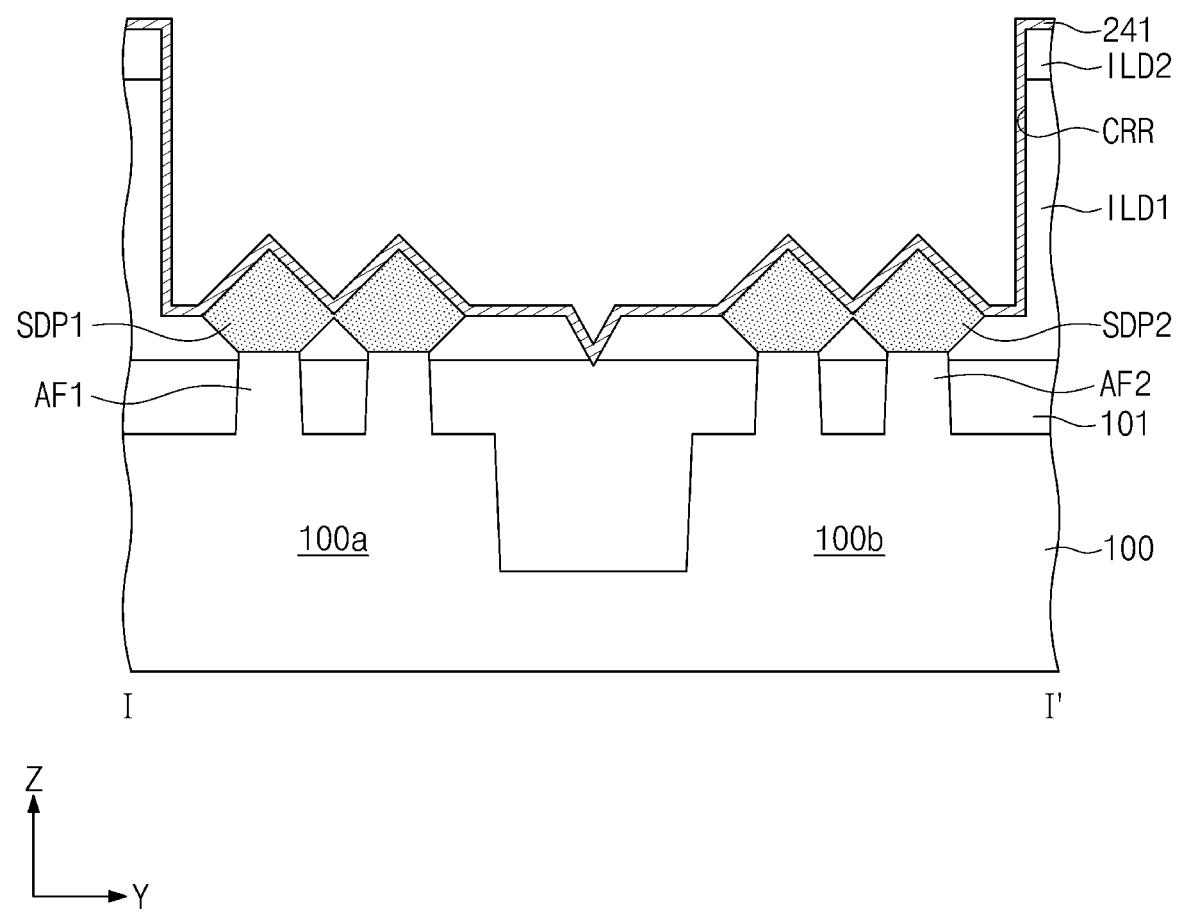
Figure 14B:
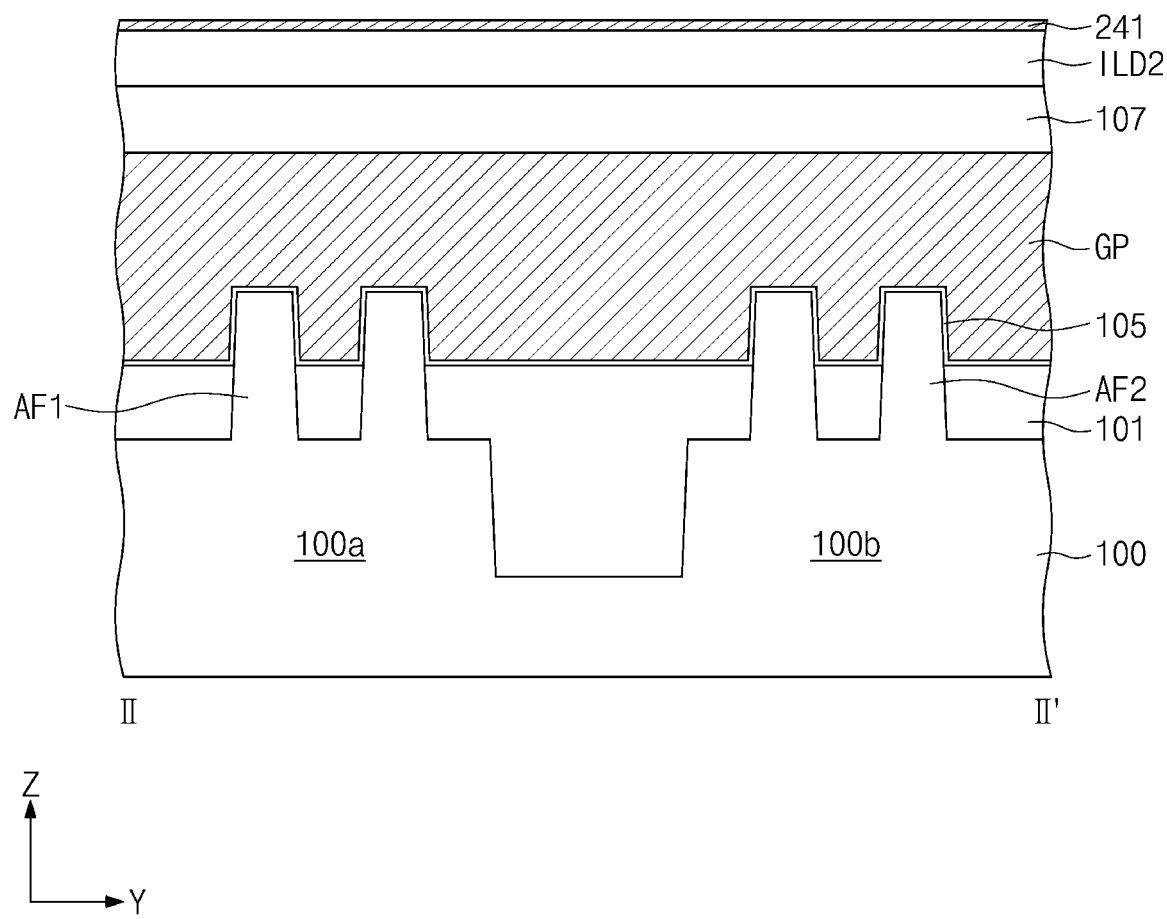
Figure 14C:
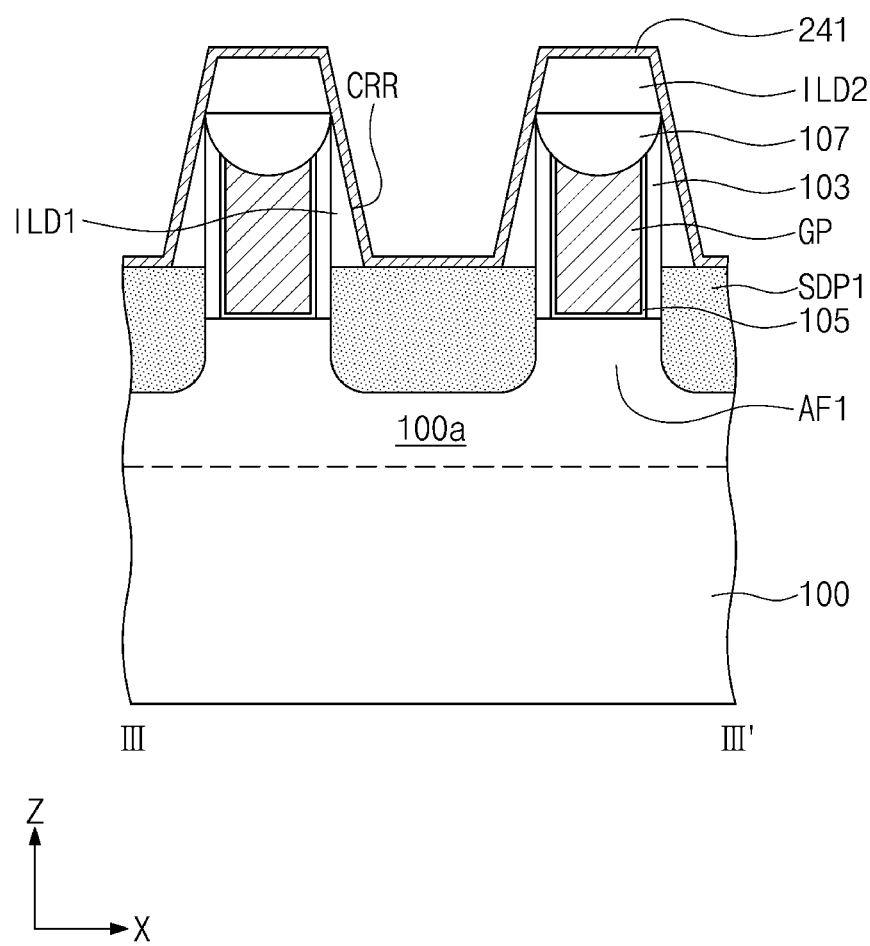

Referring to FIGS. 14A, 14B, and 14C, an etching process may be performed such that the second interlayer dielectric layer ILD2 is used as an etch mask to etch the first interlayer dielectric layer ILD1. Therefore, contact recess regions CRR may be formed to expose the top surfaces of the first and second source/drain patterns SDP1 and SDP2 between the capping patterns 107. The etching process may use an etch recipe that has an etch selectivity with respect to the capping patterns 107 and the spacers 103. For example, neither the capping patterns 107 nor the spacers 103 may be etched when the first interlayer dielectric layer ILD1 is etched. Therefore, the contact recess regions CRR may be formed when the first interlayer dielectric layer ILD1 is selectively removed from a space between the capping patterns 107 adjacent to each other in the first direction X and between the spacers 103 adjacent to each other in the first direction X. A dry etching process may be employed as the etching process for forming the contact recess regions CRR. For example, no upper portions of the first and second source/drain patterns SDP1 and SDP2 may be etched in the etching process. As another example, upper portions of the first and second source/drain patterns SDP1 and SDP2 may be etched in the etching process.

A first metal barrier layer 241 may be formed in the contact recess regions CRR. For example, the first metal barrier layer 241 may conformally cover the top surfaces of the first and second source/drain patterns SDP1 and SDP2 exposed to the contact recess regions CRR, and also conformally cover a top surface of the second interlayer dielectric layer ILD2 and bottom surfaces and sidewalls of the contact recess regions CRR. The first metal barrier layer 241 may be formed in contact with the top surfaces of the first and second source/drain patterns SDP1 and SDP2. The first metal barrier layer 241 may include, for example, one or more of titanium (Ti) and titanium nitride (TiN).

Figure 15A:
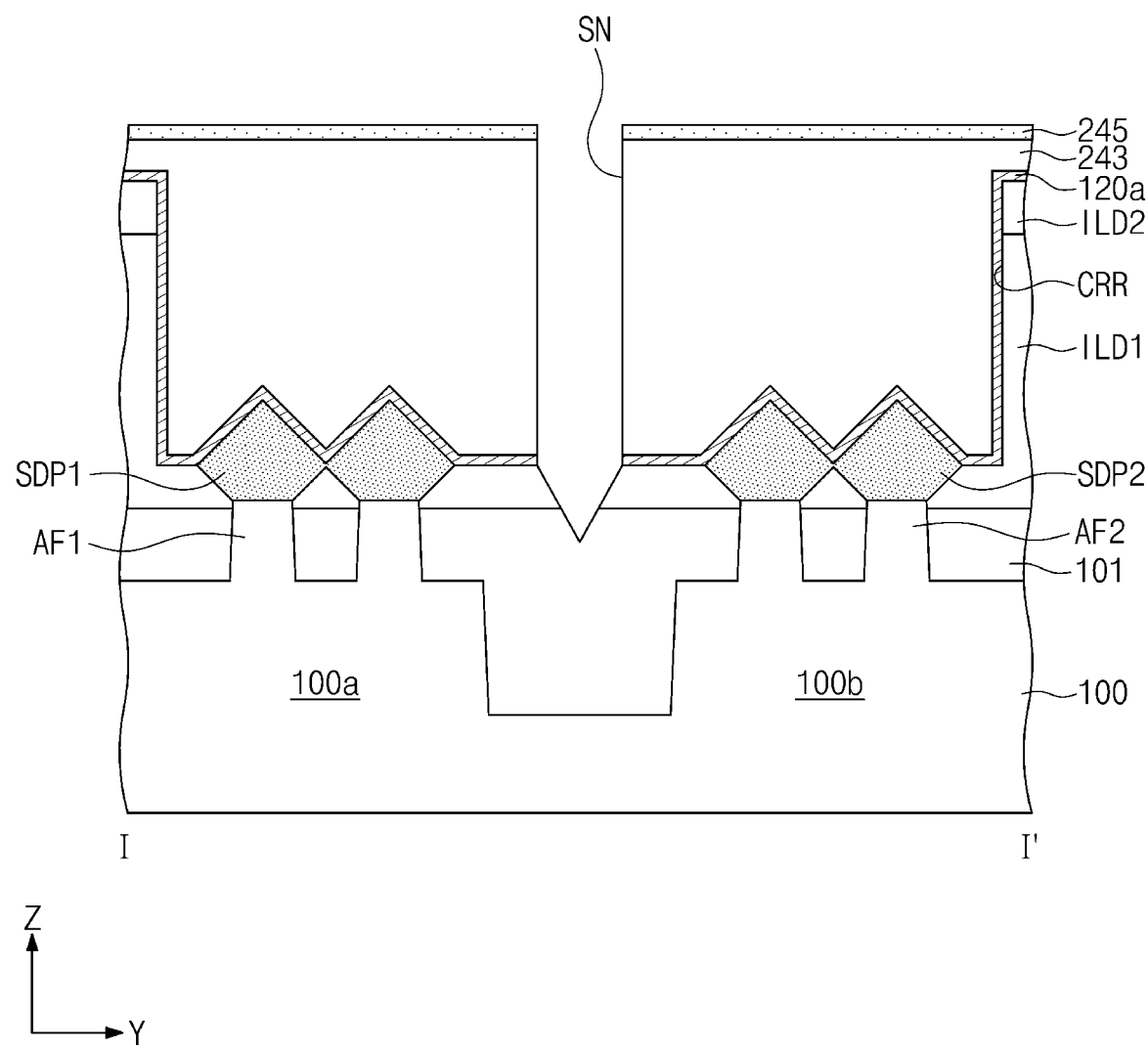
Figure 15B:
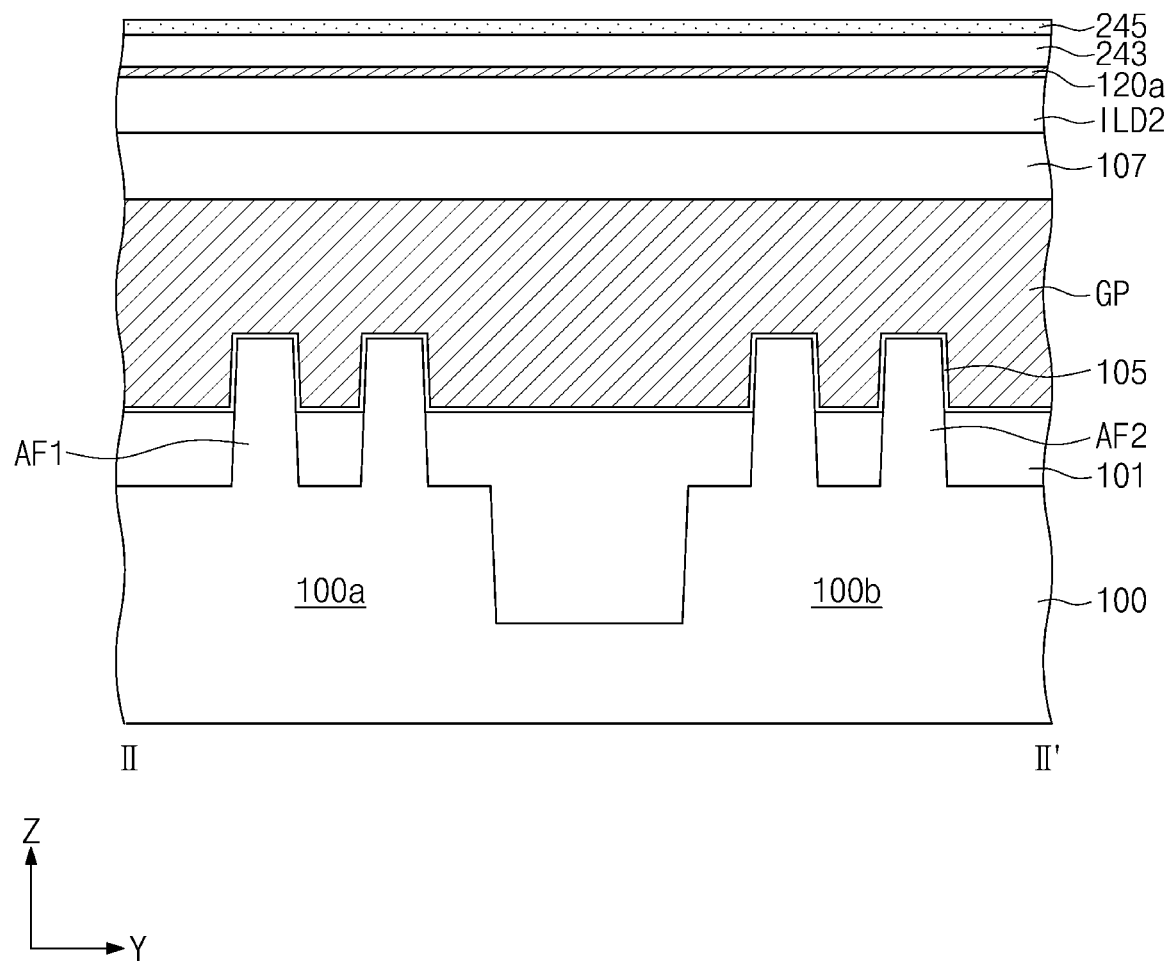
Figure 15C:
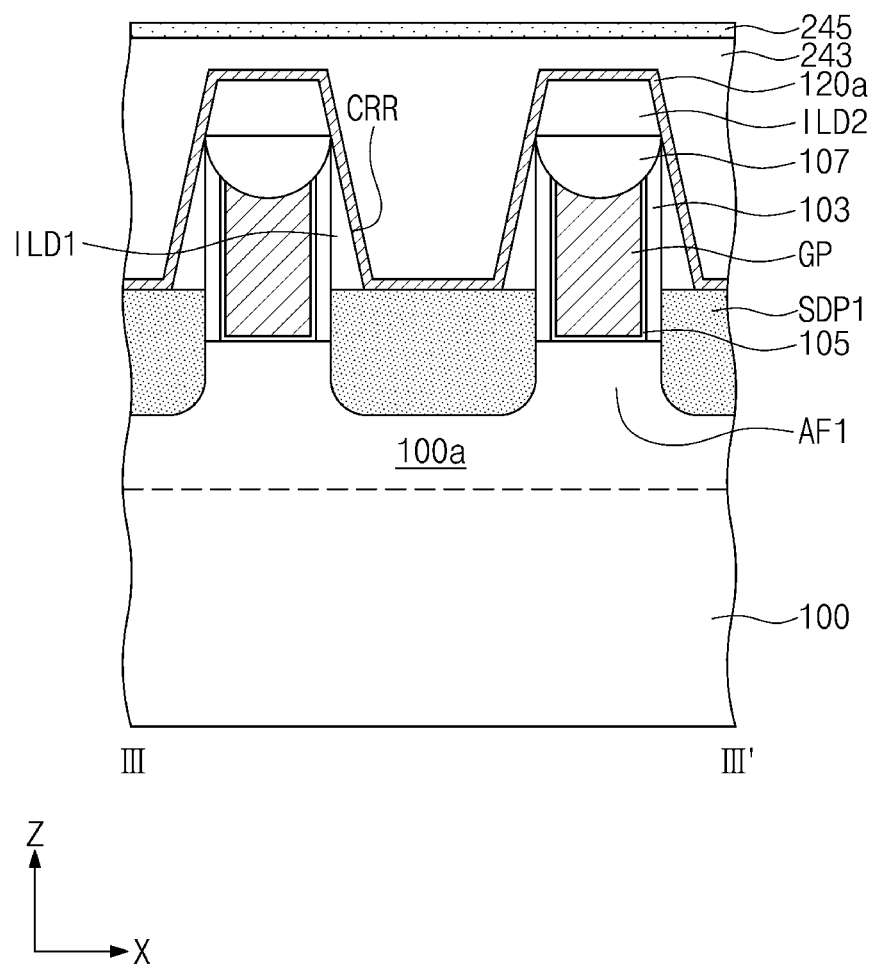

Referring to FIGS. 15A, 15B, and 15C, sacrificial contact patterns 243 and first preliminary barrier patterns 120a may be formed in the contact recess regions CRR. The formation of the sacrificial contact patterns 243 and the first preliminary barrier patterns 120a may include forming a sacrificial layer to fill the contact recess regions CRR and to cover a top surface of the first metal barrier layer 241, forming on the sacrificial layer a plurality of second mask patterns 245 that are spaced apart from each other in the second direction Y, and performing an etching process in which the second mask patterns 245 are used as an etch mask to etch the sacrificial layer and the first metal barrier layer 241. The etching process may also etch a portion of the first interlayer dielectric layer ILD1 between the first preliminary barrier patterns 120a that are adjacent to each other in the second direction Y. The etching process may form a separation opening SN between the first preliminary barrier patterns 120a adjacent to each other in the second direction Y and between the sacrificial contact patterns 243 adjacent to each other in the second direction Y. The separation opening SN may be formed between the first and second active regions 100a and 100b of the substrate 100. For example, the separation opening SN may be formed in the gap between the first and second source/drain patterns SDP1 and SDP2 in the second direction Y. The first preliminary barrier patterns 120a and the sacrificial contact patterns 243 may be formed on the first and second active regions 100a and 100b of the substrate 100. The second mask patterns 245 may include a dielectric material (e.g., a silicon nitride layer). The sacrificial contact patterns 243 may include, for example, a spin-on-hardmask (SOH) layer. The etching process may include an anisotropic etching process.

Figure 16:
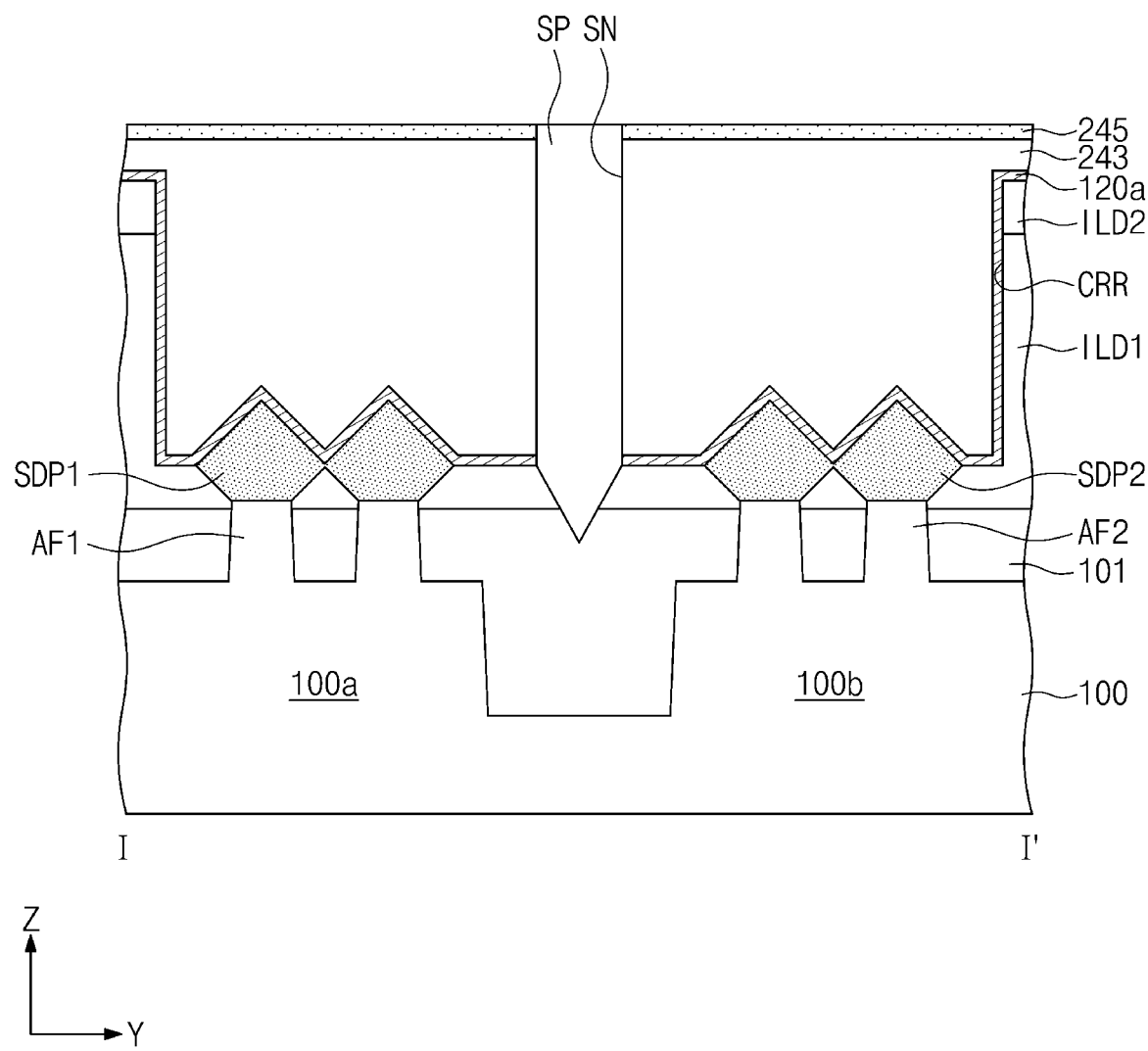

Referring to FIG. 16, a separation dielectric pattern SP may be formed in the separation opening SN. The separation dielectric pattern SP may be formed by forming a separation dielectric layer to fill the separation opening SN and to cover top surfaces of the second mask patterns 245 and then performing an etching process on the separation dielectric layer until the top surfaces of the second mask patterns 245 are exposed. The separation dielectric pattern SP may be formed between the first and second active regions 100a and 100b of the substrate 100. The separation dielectric pattern SP may be formed to have a top surface coplanar with those of the second mask patterns 245. The separation dielectric pattern SP may include a dielectric material (e.g., a silicon oxide layer or a silicon nitride layer). The etching process for forming the separation dielectric pattern SP may be performed by employing chemical mechanical polishing, dry etching, or wet etching.

Figure 17A:
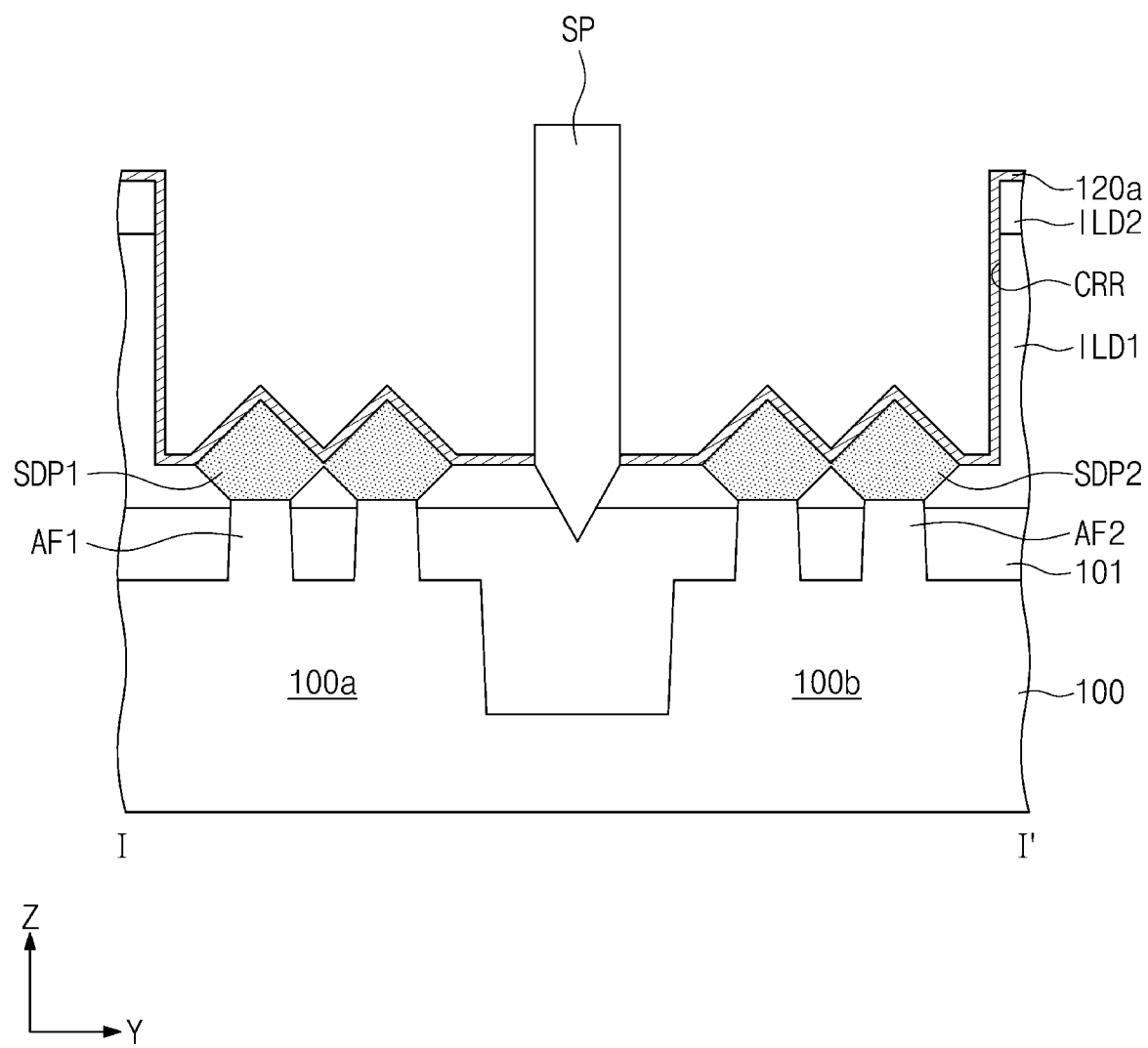
Figure 17B:
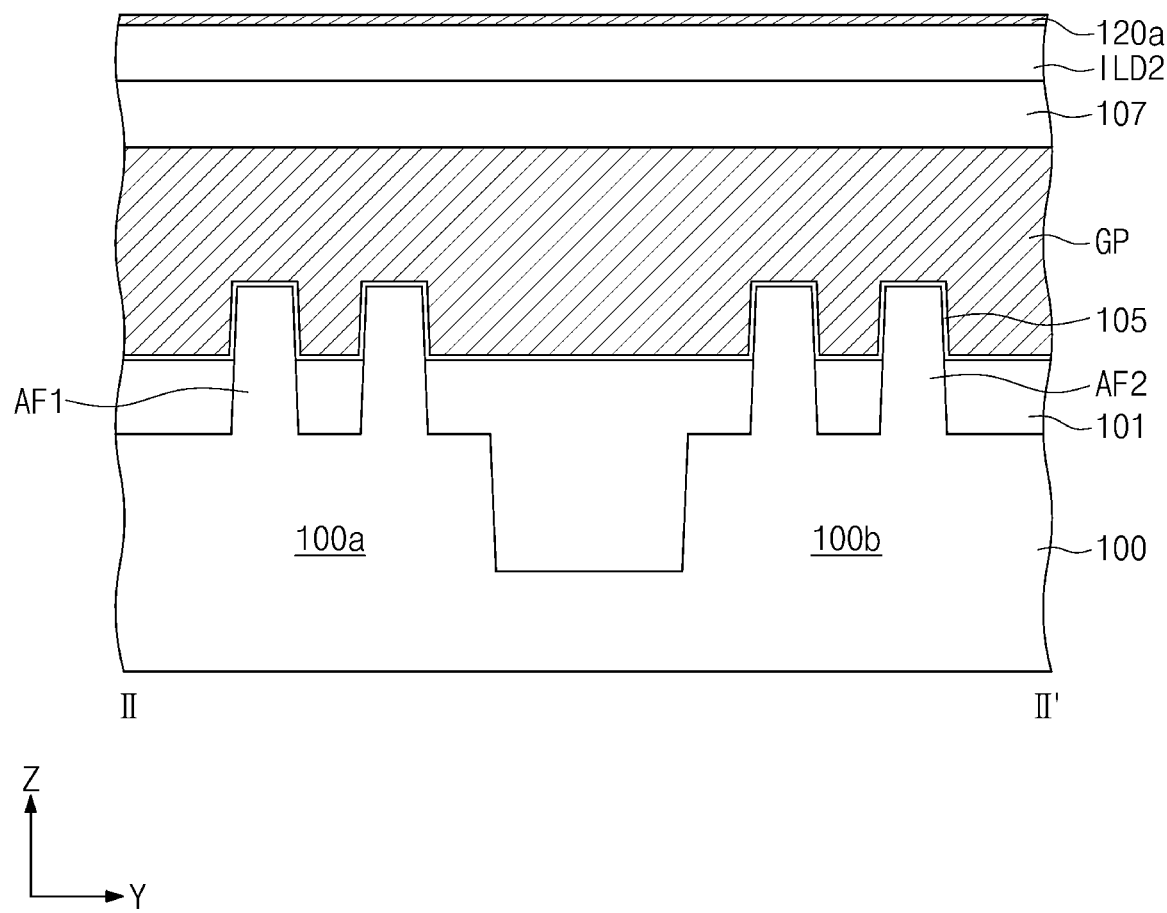
Figure 17C:
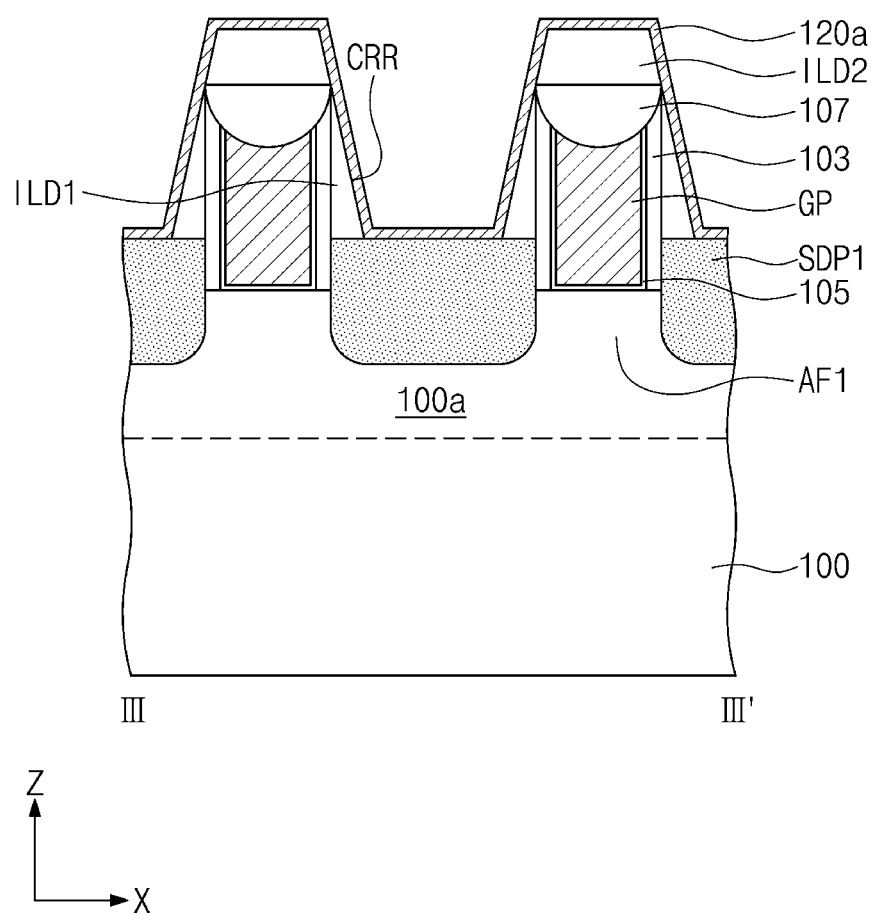

Referring to FIGS. 17A, 17B, and 17C, an etching process may be performed to selectively remove the second mask patterns 245 and the sacrificial contact patterns 243. Therefore, top surfaces of the first preliminary barrier patterns 120a may be exposed, and sidewalls of the separation dielectric pattern SP may be exposed inside the contact recess regions CRR. The etching process may include a strip process. The etching process may be performed using an etch recipe that has an etch selectivity with respect to the first preliminary barrier patterns 120a and the separation dielectric pattern SP.

Figure 18A:
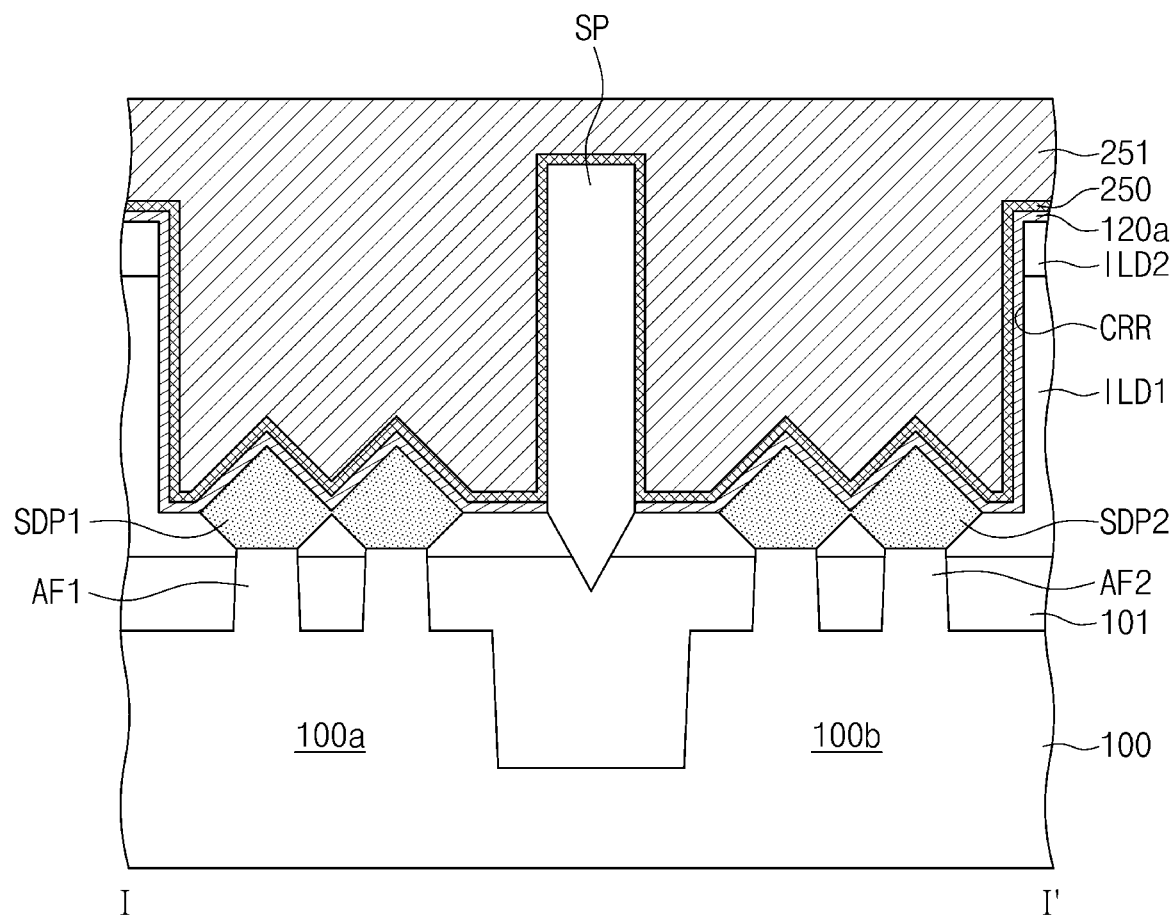
Figure 18B:
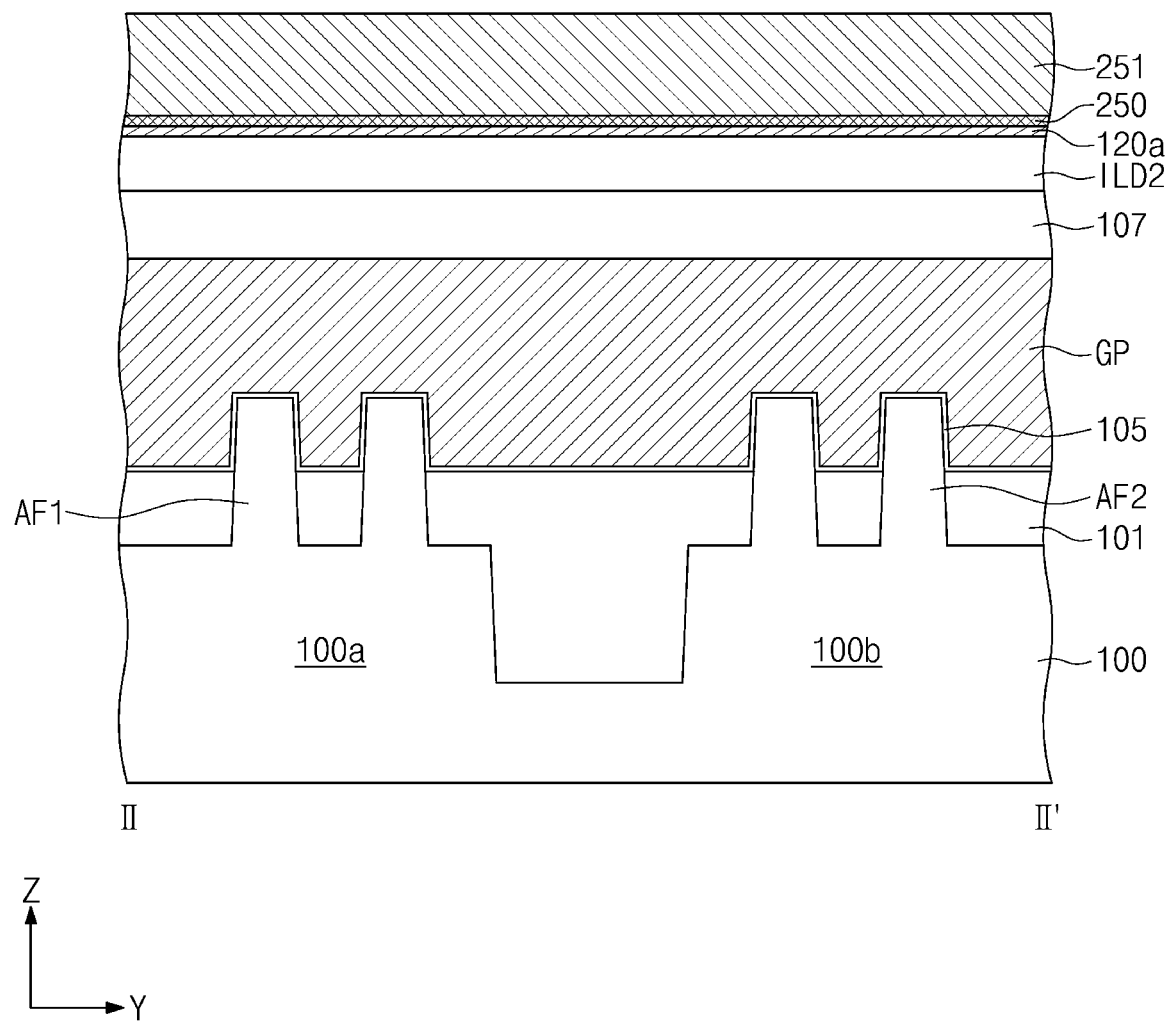
Figure 18C:
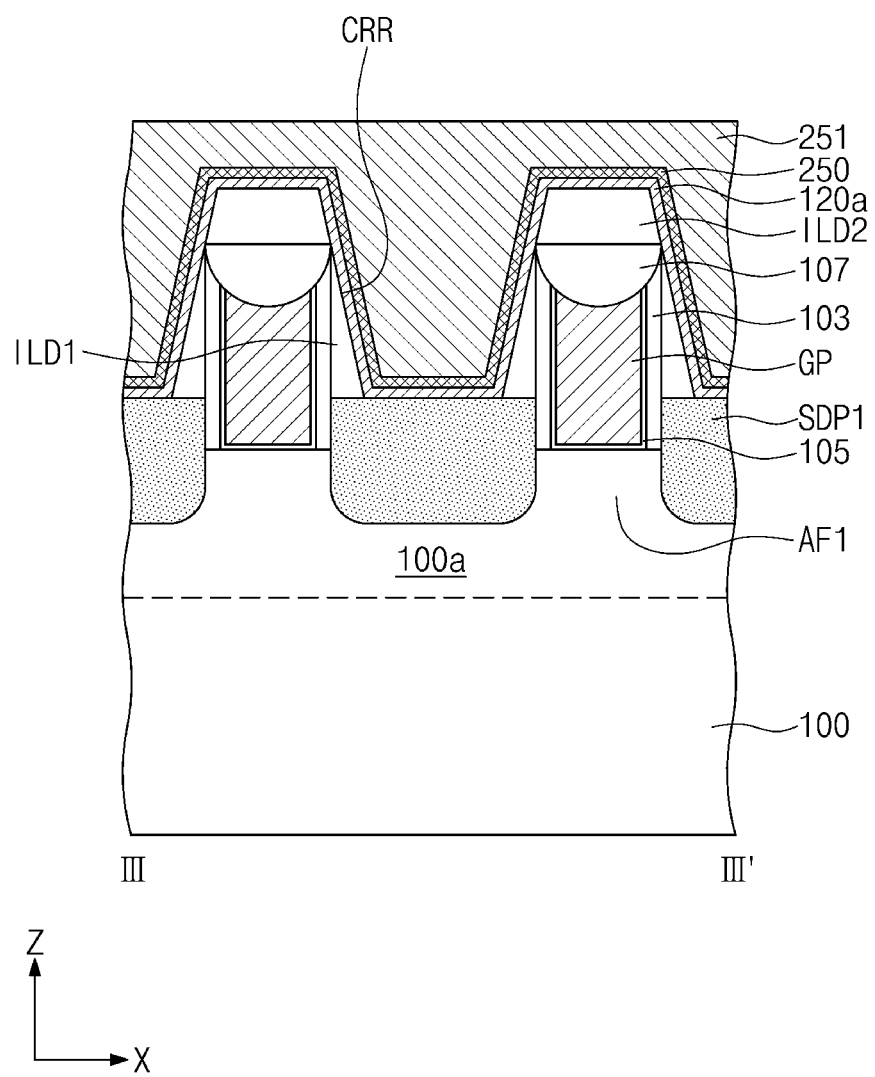

Referring to FIGS. 18A, 18B, and 18C, a second metal barrier layer 250 may be conformally formed on the top surfaces of the first preliminary barrier patterns 120a and on the sidewalls and top surface of the separation dielectric pattern SP. The second metal barrier layer 250 may cover the sidewalls and top surface of the separation dielectric pattern SP. The second metal barrier layer 250 may include one or more of titanium (Ti) and titanium nitride (TiN). A metal layer 251 may be formed on the second metal barrier layer 250. The metal layer 251 may cover a top surface of the second metal barrier layer 250 and may fill the contact recess regions CRR. The metal layer 251 may include at least one metallic material (e.g., tungsten (W), cobalt (Co), or ruthenium (Ru)).

Referring back to FIGS. 2A, 2B, and 2C, a polishing process may be performed on the metal layer 251, the second metal barrier layer 250, the first preliminary barrier patterns 120a, and the separation dielectric pattern SP. The polishing process may continue until the top surface of the second interlayer dielectric layer ILD2 is exposed. The first preliminary barrier patterns 120a, the second metal barrier layer 250, and the metal layer 251 that are formed on the top surface of the second interlayer dielectric layer ILD2 may be etched to form a first contact pattern CP1, a second contact pattern CP2, and a third contact pattern CP3 in the contact recess regions CRR. The first and second contact patterns CP1 and CP2 may be spaced apart from each other in the second direction Y with the separation dielectric pattern SP therebetween and between the gate patterns GP adjacent to each other in the first direction X. The first contact pattern CP1 may be formed on the first source/drain pattern SDP1, and the second contact pattern CP2 may be formed on the second source/drain pattern SDP2. Each of the first and second contact patterns CP1 and CP2 may include a first barrier pattern 120 formed by etching the first preliminary barrier pattern 120a, a second barrier pattern 122 formed by etching the second metal barrier layer 250, a metal pattern 124 formed by etching the metal layer 251, and an interfacial pattern 126 formed by a chemical combination between the first barrier pattern 120 and each of the first and second source/drain patterns SDP1 and SDP2. The interfacial pattern 126 may be formed between the first barrier pattern 120 and each of the first and second source/drain patterns SDP1 and SDP2.

The third contact pattern CP3 may be formed on the first and second source/drain patterns SDP1 and SDP2 between the gate patterns GP adjacent to each other in the first direction X. The third contact pattern CP3 may be disposed spaced apart from the first and second contact patterns CP1 and CP2 in the first direction X. The third contact pattern CP3 may include a first barrier pattern 130 formed by etching the first preliminary barrier pattern 120a, a second barrier pattern 132 formed by etching the second metal barrier layer 250, a metal pattern 134 formed by etching the metal layer 251, and interfacial patterns 136 formed by a chemical combination between the first barrier pattern 120 and the first and second source/drain patterns SDP1 and SDP2.

According to exemplary embodiments of the present inventive concepts, after the formation of the separation dielectric pattern SP that physically separates the first preliminary barrier pattern 120a on the first source/drain pattern SDP1 from the first preliminary barrier pattern 120a on the second source/drain pattern SDP2, the second metal barrier layer 250 may be formed on the first barrier patterns 120, and then, the first and second barrier patterns 120 and 122 may be formed by performing a polishing process on the first preliminary barrier pattern 120a and the second metal barrier layer 250. Accordingly, a strip process does not have to be performed on barrier metal layers, nor does a lift-off process have to be performed on the first interlayer dielectric layer ILD1 to form the first and second barrier patterns 120 and 122 on the first and second source/drain patterns SDP1 and SDP2. As a result, it is possible to prevent the formation of an unnecessary layer (due to the lift-off and strip processes) that can an increase a resistance between the first barrier pattern 120 and the interfacial pattern 126 including a semiconductor material.

Figure 19A:
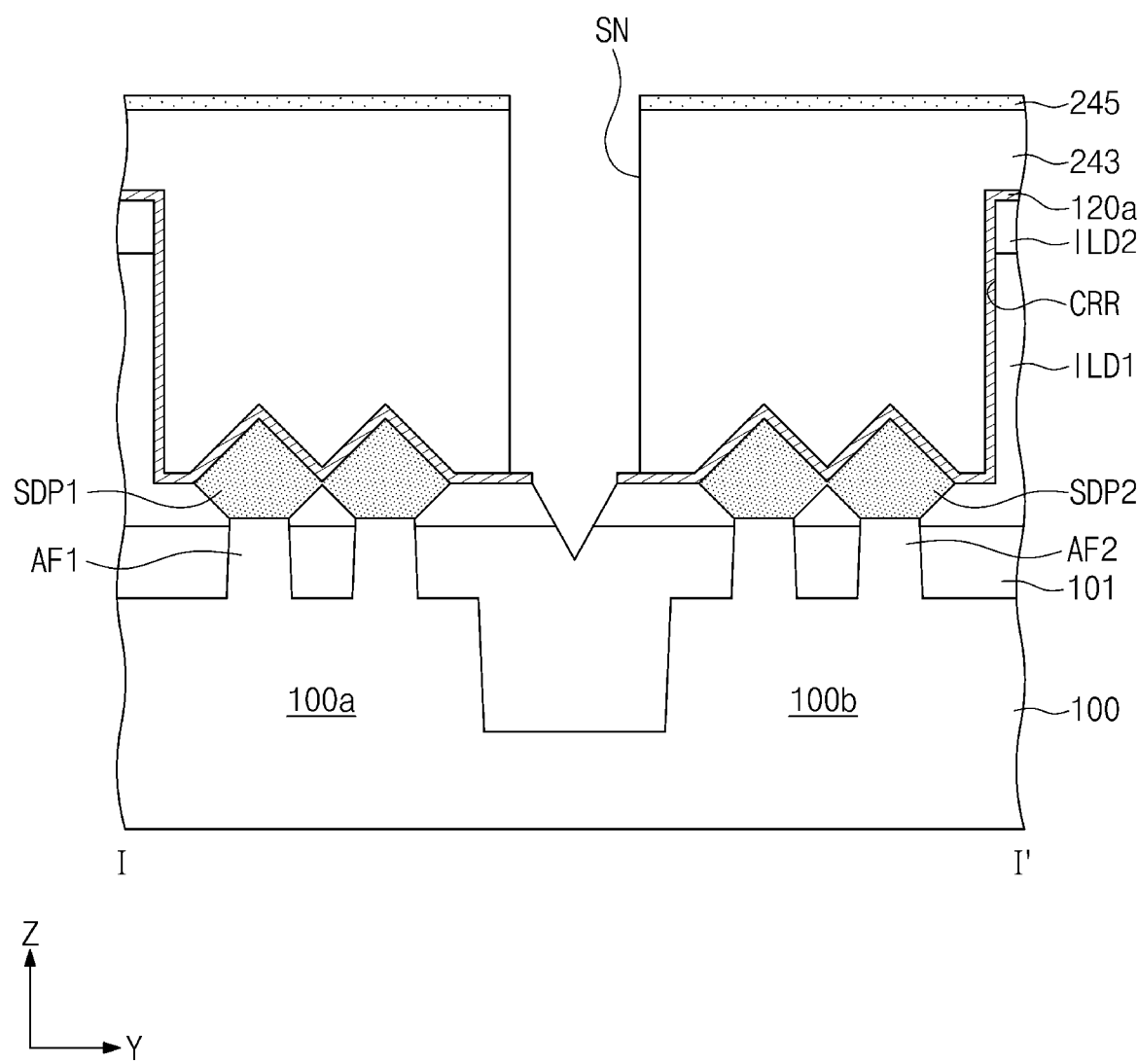
FIGS. 19A and 19B illustrate cross-sectional views taken along line I-I' of FIG. 1, showing a method of fabricating a semiconductor device according to exemplary embodiments of the present inventive concept.
Figure 19B:
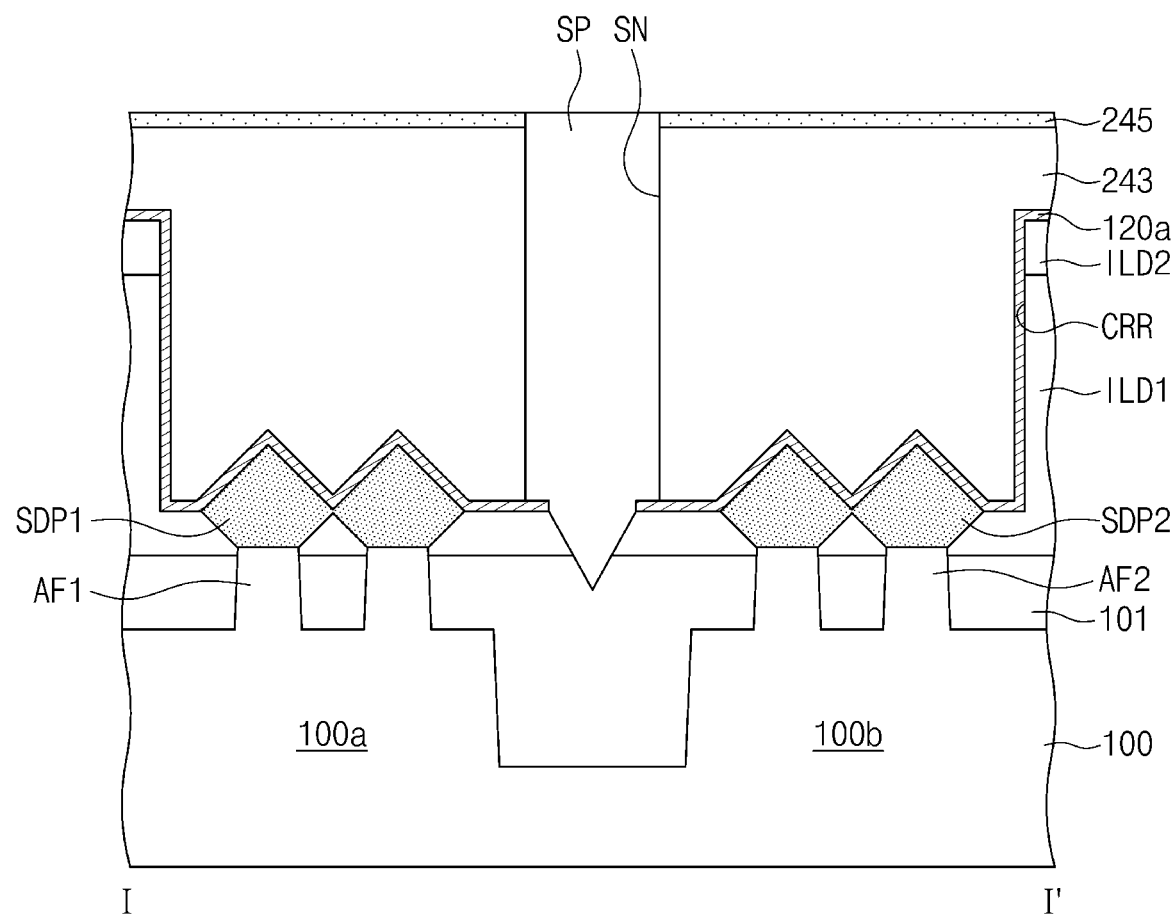

FIGS. 19A and 19B illustrate cross-sectional views taken along line I-I' of FIG. 1, showing a method of fabricating a semiconductor device according to exemplary embodiments of the present inventive concept.

Referring together to FIGS. 15A and 19A, a horizontal enlargement process may be performed on the separation opening SN. In other words, the size of the separation opening SN in the second direction Y may be increased. The horizontal enlargement process may include an etching process that etches sidewalls of the separation opening SN. The etching process may use an etching gas for etching the sacrificial contact patterns 243. Portions of the second mask patterns 245 may also be etched when portions of the sacrificial contact patterns 243 are etched. The etching process may be an anisotropic etching process. During the horizontal enlargement process, the first preliminary barrier patterns 120a may not be etched due to their etch selectivity to the etching gas. Therefore, the separation opening SN may partially expose the top surfaces of the first preliminary barrier patterns 120a. The horizontal enlargement process may be performed such that a distance between the sacrificial contact patterns 243 adjacent to each other in the second direction Y may be greater than a distance between the first preliminary barrier patterns 120a adjacent to each other in the second direction Y.

In exemplary embodiments of the present inventive concept, the horizontal enlargement process may control widths in the second direction Y of the first and second contact patterns CP1 and CP2 which will be formed subsequently. Therefore, it is possible to adjust a capacitance between the first and second contact patterns CP1 and CP2.

Referring to FIG. 19B, the separation dielectric pattern SP may be formed in the separation opening SN. The separation dielectric pattern SP may fill the separation opening SN. The separation dielectric pattern SP may partially cover the top surfaces of the first preliminary barrier patterns 120a exposed to the separation opening SN.

The following processes thereafter are identical or substantially similar to those discussed with reference to FIGS. 17A, 18A, and 2A, and thus the repetitive description is omitted for brevity.

According to exemplary embodiments of the present inventive concept, there is no need to perform a strip process on a barrier metal layer and a lift-off process on an interlayer dielectric layer to form barrier patterns on first and second source/drain patterns. Accordingly, it is possible to prevent an unnecessary layer from being formed, which can lead to an increase in resistance between the barrier pattern and a semiconductor-containing interfacial pattern, wherein the formation of the unnecessary layer happens due to the lift-off and strip processes.

While the present inventive concept has been described with reference to exemplary embodiments thereof, it will be understood by those skilled in the art that various changes and modifications may be made thereto without departing from the scope of the present inventive concept.

What is claimed is:

1. A semiconductor device, comprising:
a substrate that includes a first active region and a second active region;
a first source/drain pattern on the first active region;
a second source/drain pattern on the second active region;
an interlayer dielectric layer that is on the substrate and covers the first source/drain pattern and the second source/drain pattern;
a separation dielectric pattern on the substrate between the first source/drain pattern and the second source/drain pattern, penetrating the interlayer dielectric layer; and
a first contact pattern on the first source/drain pattern,
wherein the first contact pattern includes:
a first metal pattern;
a first barrier pattern between the first metal pattern and the first source/drain pattern; and
a second barrier pattern between the first barrier pattern and the first source/drain pattern,
wherein the first barrier pattern contacts the separation dielectric pattern and extends along a sidewall of the first metal pattern adjacent to the separation dielectric pattern.

2. The semiconductor device of claim 1, wherein the first barrier pattern completely surrounds the first metal pattern, and the second barrier pattern exposes a portion of the first barrier pattern.

3. The semiconductor device of claim 1, further comprising a second contact pattern on the second source/drain pattern,
wherein the second contact pattern includes:
a second metal pattern;
a third barrier pattern between the second metal pattern and the second source/drain pattern; and
a fourth barrier pattern between the third barrier pattern and the second source/drain pattern,
wherein the third barrier pattern contacts the separation dielectric pattern and extends along a sidewall of the second metal pattern adjacent to the separation dielectric pattern.

4. The semiconductor device of claim 3, wherein a distance between the second barrier pattern of the first contact pattern and the fourth barrier pattern of the second contact pattern is different from a distance between the first barrier pattern of the first contact pattern and the third barrier pattern of the second contact pattern.

5. The semiconductor device of claim 3, wherein a distance between the second barrier pattern of the first contact pattern and the fourth barrier pattern of the second contact pattern is the same as a distance between the first barrier pattern of the first contact pattern and the third barrier pattern of the second contact pattern.

6. The semiconductor device of claim 1, wherein
the second barrier pattern covers a top surface of the first source/drain pattern, the first barrier pattern covers a top surface of the second barrier pattern, and the first metal pattern covers a top surface of the first barrier pattern.

7. The semiconductor device of claim 1, wherein a top surface of the first metal pattern and a top surface of the first barrier pattern are coplanar with a top surface of the separation dielectric pattern.

8. The semiconductor device of claim 1, wherein
the first active region and the second active region are spaced apart from each other in a first direction,
when viewed in a plan, the second barrier pattern includes:
a plurality of first segments that are spaced apart from each other in a second direction intersecting the first direction; and
a second segment that connects first ends of the first segments to each other and is parallel to the second direction,
the second segment is spaced apart from the separation dielectric pattern, and
second ends of the first segments are in contact with the separation dielectric pattern, the second ends being opposite to the first ends.

9. The semiconductor device of claim 1,
wherein the substrate further includes:
a first active fin that vertically protrudes from a top surface of the first active region; and
a second active fin that vertically protrudes from a top surface of the second active region, wherein
the first and second active fins extend in a first direction,
the first source/drain pattern is disposed on a first portion of the first active fin, and
the second source/drain pattern is disposed on a first portion of the second active fin,
wherein the semiconductor device further comprises:
a plurality of first active patterns that are spaced apart from each other in a vertical direction on a top surface of a second portion of the first active fin;
a plurality of second active patterns that are spaced apart from each other in the vertical direction on a top surface of a second portion of the second active fin; and
a gate pattern that surrounds the first and second active patterns and extends in a second direction on the second portions of the first and second active fins, the second direction intersecting the first direction.

10. A semiconductor device, comprising:
a first active fin that protrudes in a vertical direction from a top surface of a substrate;
a first source/drain pattern on the first active fin;
an interlayer dielectric layer that is on the substrate and covers the first source/drain pattern; and
a first contact pattern in the interlayer dielectric layer and in contact with the first source/drain pattern,
wherein the first contact pattern includes:
a first metal pattern;
a first barrier pattern between the first metal pattern and the first source/drain pattern;
a second barrier pattern between the first barrier pattern and the first metal pattern; and
a separation dielectric pattern on the substrate on a side of the first active fin, the separation dielectric pattern penetrating the interlayer dielectric layer,
wherein the second barrier pattern is arranged along sidewalls of the first metal pattern, and
wherein a portion of the second barrier pattern is exposed by the first barrier pattern.

11. The semiconductor device of claim 10, wherein the first barrier pattern covers at least one sidewall of the second barrier pattern.

12. The semiconductor device of claim 10,
wherein the second barrier pattern is between the separation dielectric pattern and the first metal pattern.

13. The semiconductor device of claim 10,
wherein a sidewall of the second barrier pattern and a sidewall of the first barrier pattern are in contact with the separation dielectric pattern,
the sidewall of the first barrier pattern and the sidewall of the second barrier pattern in contact with the separation dielectric pattern are aligned with each other.

14. The semiconductor device of claim 10,
wherein a sidewall of the second barrier pattern and a sidewall of the first barrier pattern are in contact with the separation dielectric pattern,
the sidewall of the second barrier pattern and the sidewall of the first barrier pattern in contact with the separation dielectric pattern are not aligned with each other.

15. The semiconductor device of claim 10, further comprising:
a second active fin that protrudes in the vertical direction from the top surface of the substrate, the second active fin being adjacent to the first active fin;
a second source/drain pattern on the second active fin and covered with the interlayer dielectric layer; and
a second contact pattern in the interlayer dielectric layer and in contact with the second source/drain pattern,
wherein the second contact pattern includes:
a second metal pattern;
a third barrier pattern between the second metal pattern and the second source/drain pattern; and
a fourth barrier pattern between the third barrier pattern and the second metal pattern,
wherein a distance between the first barrier pattern and the third barrier pattern is the same as a distance between the second barrier pattern and the fourth barrier pattern.

16. The semiconductor device of claim 10, further comprising:
a second active fin that protrudes in the vertical direction from the top surface of the substrate, the second active fin being adjacent to the first active fin;
a second source/drain pattern on the second active fin and covered with the interlayer dielectric layer; and
a second contact pattern in the interlayer dielectric layer and in contact with the second source/drain pattern,
wherein the second contact pattern includes:
a second metal pattern;
a third barrier pattern between the second metal pattern and the second source/drain pattern; and
a fourth barrier pattern between the third barrier pattern and the second metal pattern,
wherein a distance between the first barrier pattern and the third barrier pattern is different than a distance between the second barrier pattern and the fourth barrier pattern.

17. A semiconductor device, comprising;
a plurality of active fins that protrude from a top surface of a substrate and extend in a first direction, the active fins being adjacent to each other;
a gate pattern arranged in a second direction across the active fins, the second direction intersecting the first direction;
a first source/drain pattern on the active fins on a first side of the gate pattern; and
a first contact pattern on the first source/drain pattern, wherein the first contact pattern includes:

a first metal pattern; and a first barrier pattern that covers a first sidewall and a second sidewall of the first metal pattern, wherein the first barrier pattern includes a first part that covers the first sidewall of the first metal pattern and a second part that covers the second sidewall of the first metal pattern, wherein the first part includes a single layer, and wherein the second part includes a plurality of layers, wherein the first sidewall and the second sidewall are parallel to the second direction.

18. The semiconductor device of claim 17, wherein the first barrier pattern includes a third part that covers a third sidewall of the first metal pattern and a fourth part that covers a fourth sidewall of the first metal pattern, wherein the third sidewall and the fourth sidewall are parallel to the first direction, and wherein the third part and the fourth part include a plurality of layers.

19. The semiconductor device of claim 17, further comprising:

a second source/drain pattern on the active fins on a second side of the gate pattern, the second side being opposite to the first side; and a second contact pattern on the second source/drain pattern, wherein the second contact pattern includes:

a second metal pattern; and a second barrier pattern that covers a first sidewall and a second sidewall of the second metal pattern, wherein the first and second sidewalls of the second metal pattern are parallel to the first and second sidewalls of the first metal pattern, wherein the second harrier pattern includes a third part that covers the first sidewall of the second metal pattern and a fourth part that covers the second sidewall of the second metal pattern, wherein the third part of the second barrier pattern includes a plurality of layers, and wherein the fourth part of the second barrier pattern includes a plurality of layers.

* * * * *